(12) United States Patent
Tsuruma et al.

(10) Patent No.: US 9,897,871 B2
(45) Date of Patent: Feb. 20, 2018

(54) LIQUID CRYSTAL DISPLAY DEVICE

(71) Applicant: Japan Display Inc., Minato-ku (JP)

(72) Inventors: Takeyuki Tsuruma, Tokyo (JP);
Masakatsu Kitani, Tokyo (JP);
Yoshihide Ohue, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/475,449

(22) Filed: Mar. 31, 2017

(65) Prior Publication Data

US 2017/0285421 A1    Oct. 5, 2017

(30) Foreign Application Priority Data

Apr. 1, 2016 (JP) .................................. 2016-074354

(51) Int. Cl.
*H01L 27/14* (2006.01)
*G02F 1/1343* (2006.01)
*G02F 1/1362* (2006.01)
*G02F 1/1368* (2006.01)
*H01L 27/12* (2006.01)
*H01L 29/786* (2006.01)

(52) U.S. Cl.
CPC ...... *G02F 1/134336* (2013.01); *G02F 1/1368* (2013.01); *G02F 1/136286* (2013.01); *H01L 27/1222* (2013.01); *H01L 27/1244* (2013.01); *H01L 27/1274* (2013.01); *H01L 29/78645* (2013.01); *H01L 29/78675* (2013.01); *G02F 2001/134345* (2013.01); *G02F 2201/121* (2013.01); *G02F 2201/123* (2013.01); *G02F 2201/52* (2013.01)

(58) Field of Classification Search
CPC ............. H01L 27/1222; H01L 27/1244; H01L 27/1274; H01L 29/78645; H01L 29/78675
USPC ........................................... 257/59, 72, 432
See application file for complete search history.

(56) References Cited

U.S. PATENT DOCUMENTS

2015/0346572 A1    12/2015  Hirosawa

FOREIGN PATENT DOCUMENTS

JP          2015-225300          12/2015

*Primary Examiner* — Tan N Tran
(74) *Attorney, Agent, or Firm* — Oblon, McClelland, Maier & Neustadt, L.L.P.

(57) ABSTRACT

According to one embodiment, a liquid crystal display device includes a first scanning line, a third scanning line, a second scanning line, a first linear electrode, a second linear electrode and a third linear electrode. The first linear electrode is located between the first scanning line and the second scanning line, and extends in a third direction. The second linear electrode is located between the first scanning line and the second scanning line, and extends in a fourth direction. The third linear electrode is located between the second scanning line and the third scanning line, and comprises a portion extending in the fourth direction. The second linear electrode is electrically connected to the third linear electrode.

15 Claims, 16 Drawing Sheets

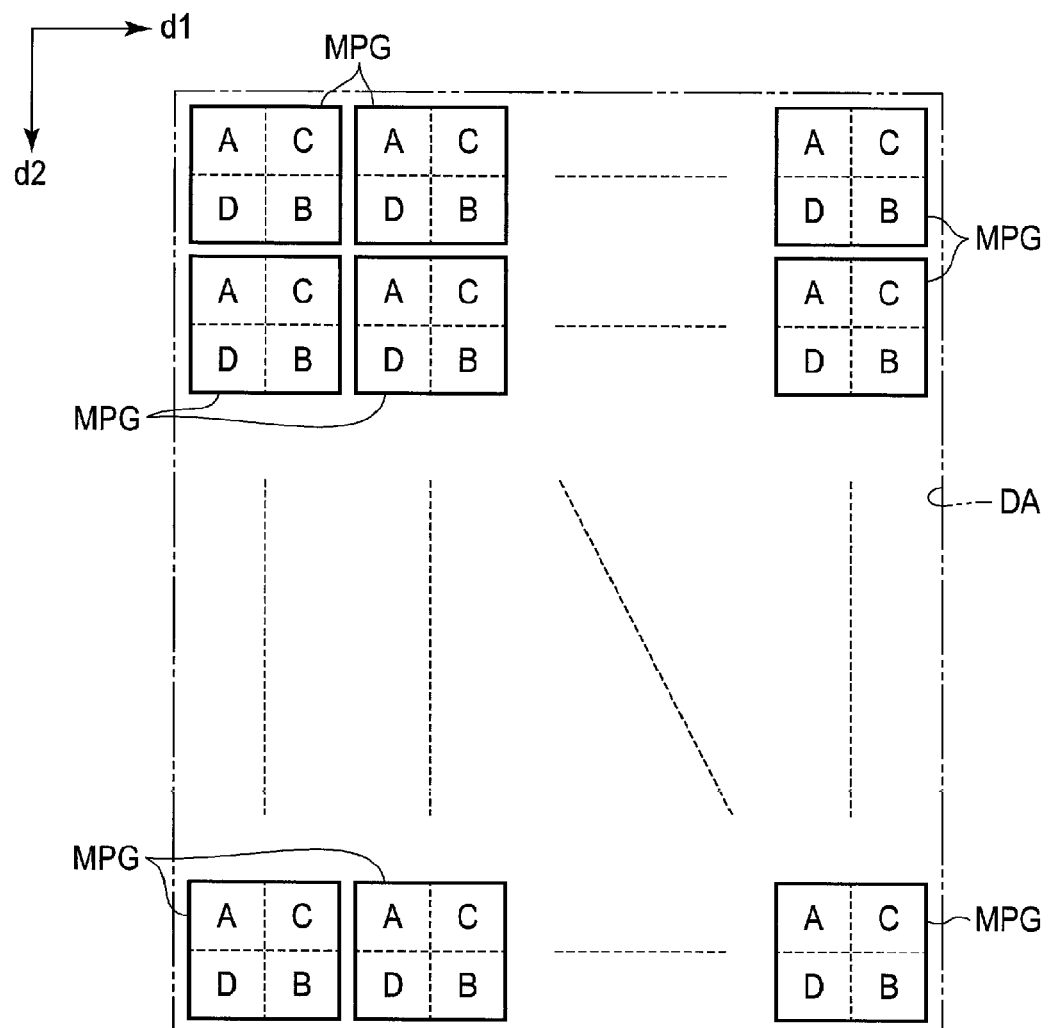
F I G. 3

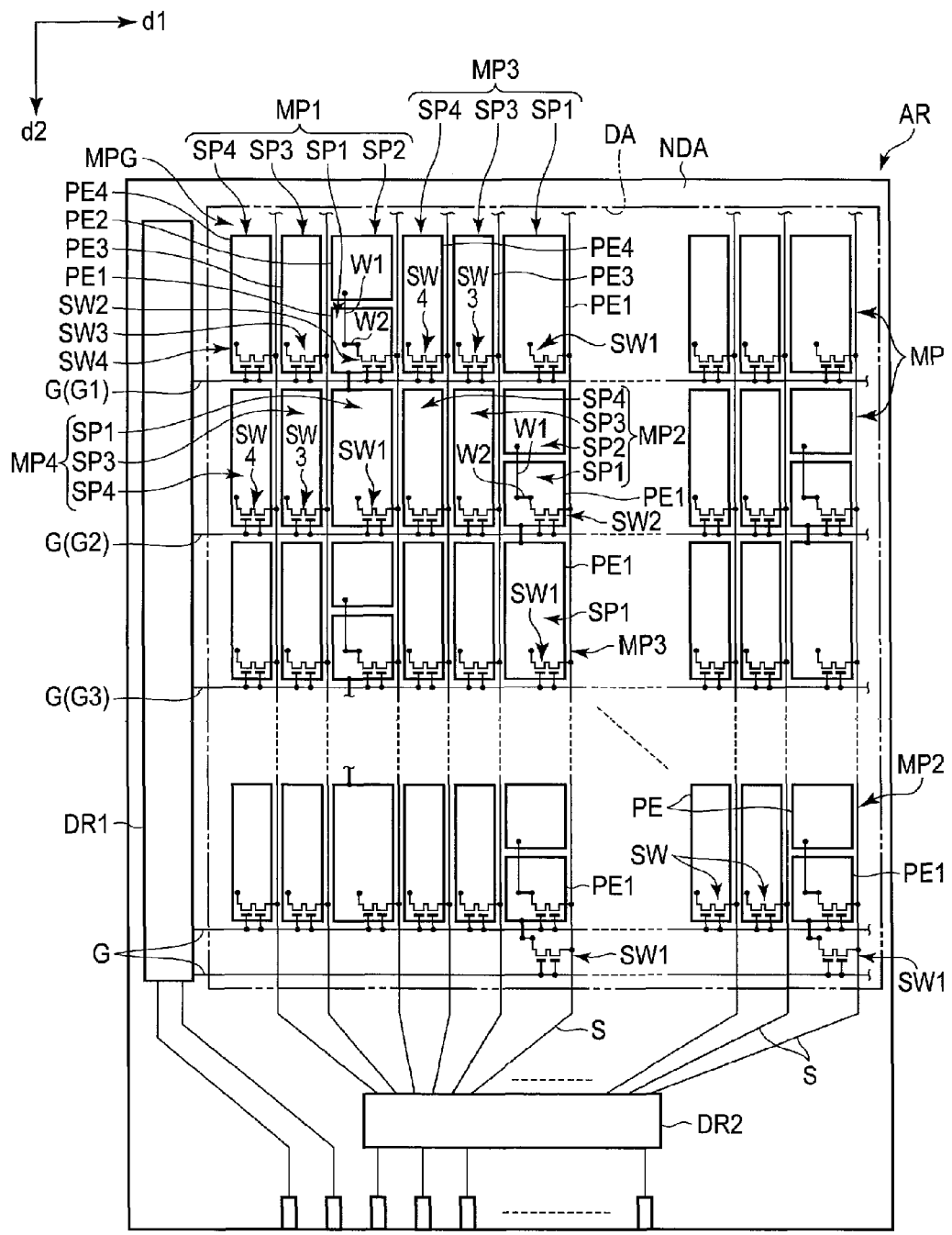
F I G. 5

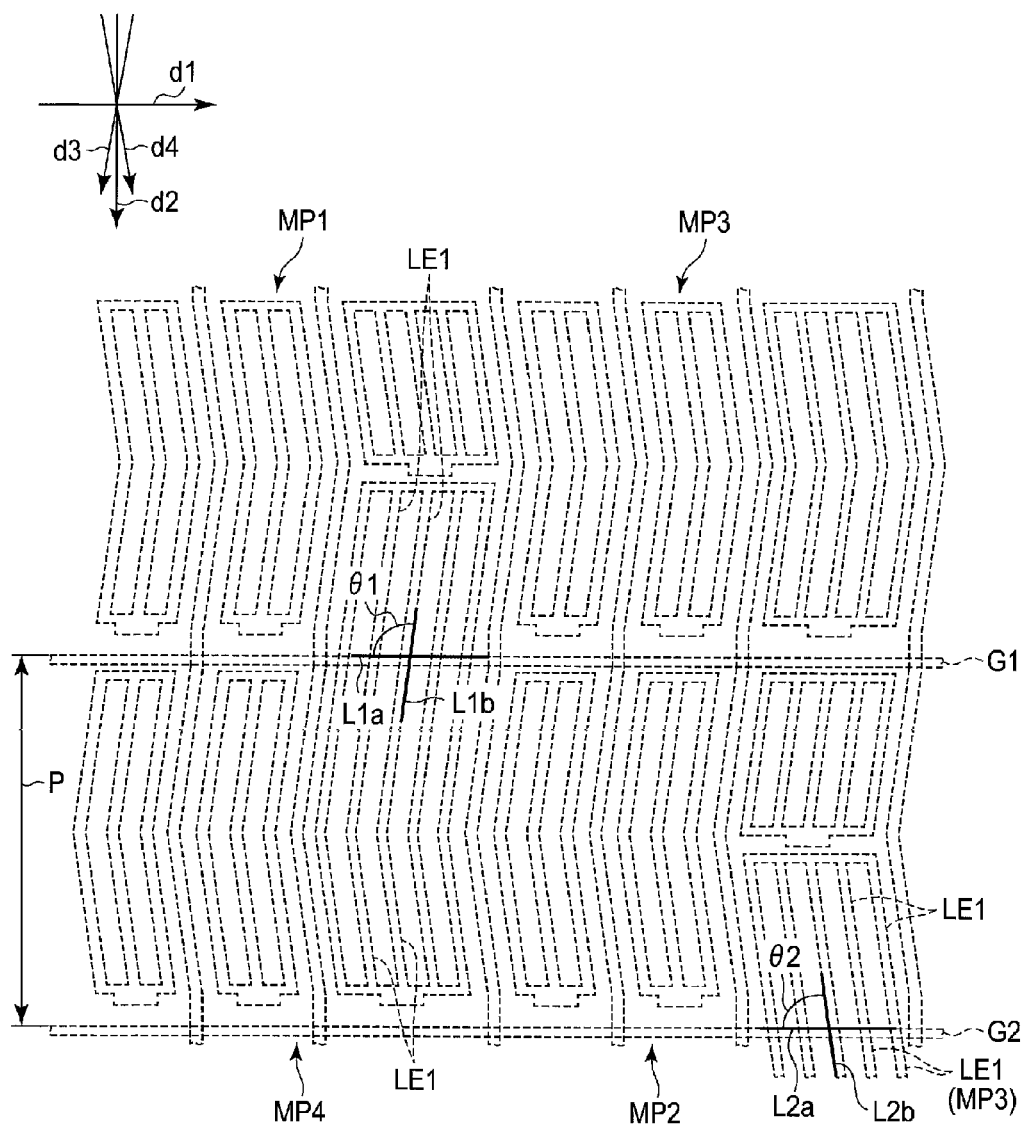
F I G. 10

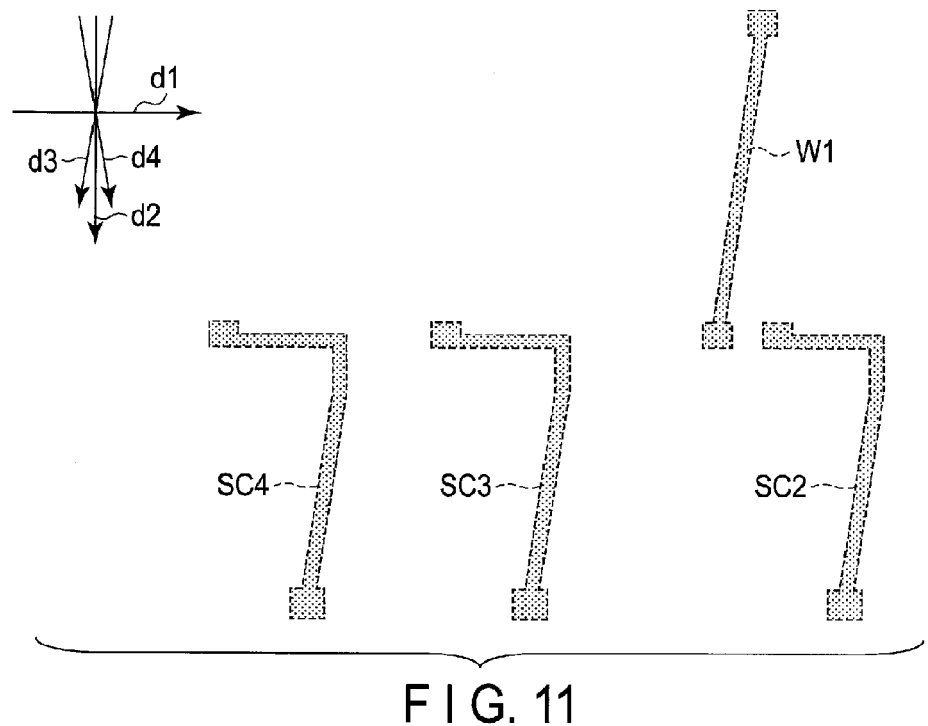
F I G. 11
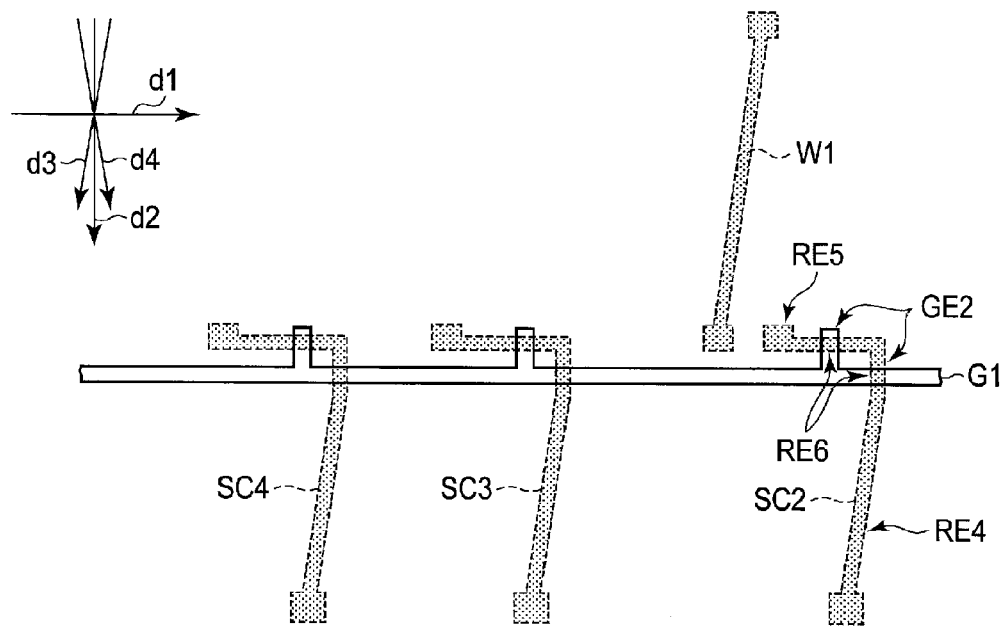
F I G. 12

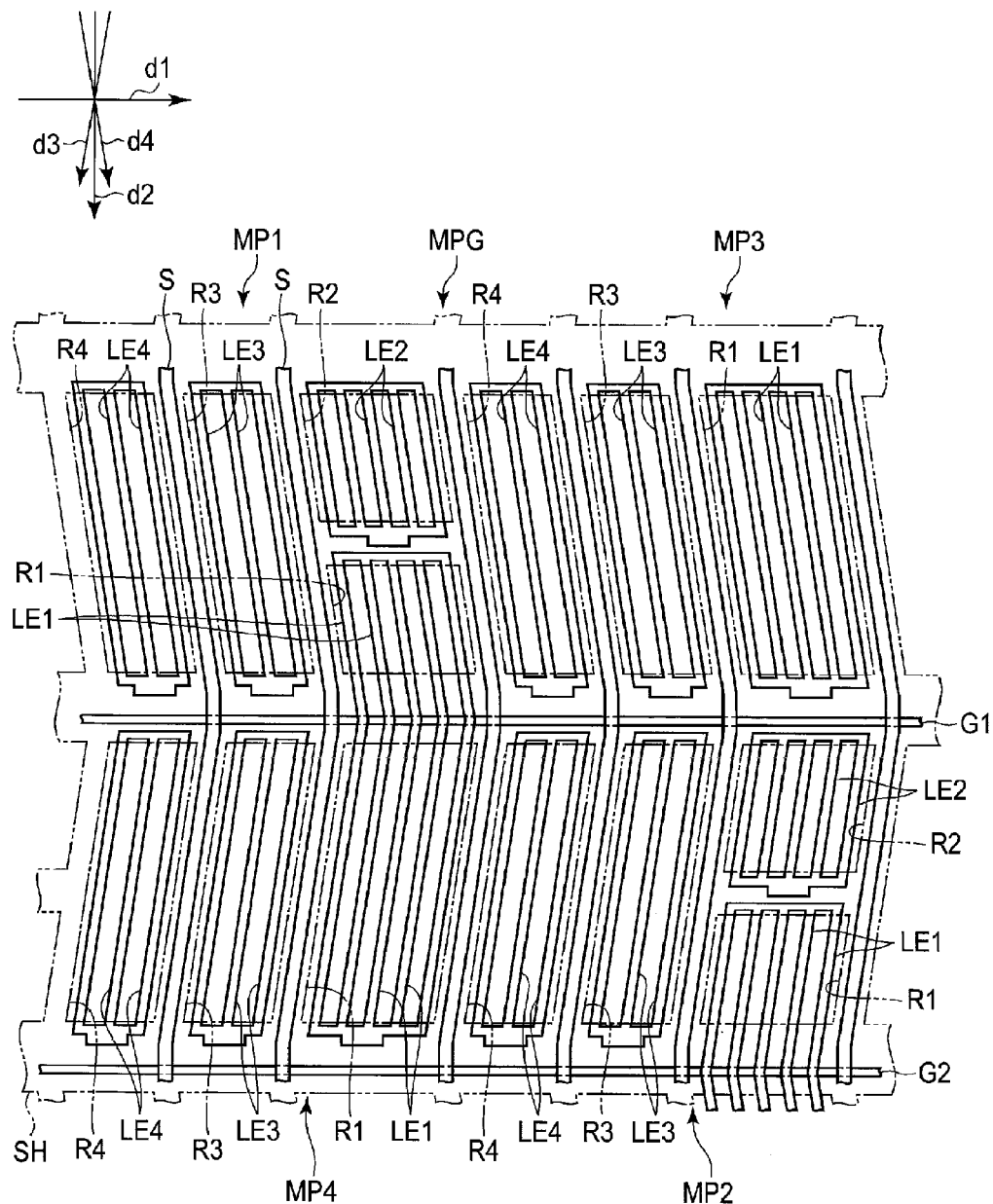
F I G. 15

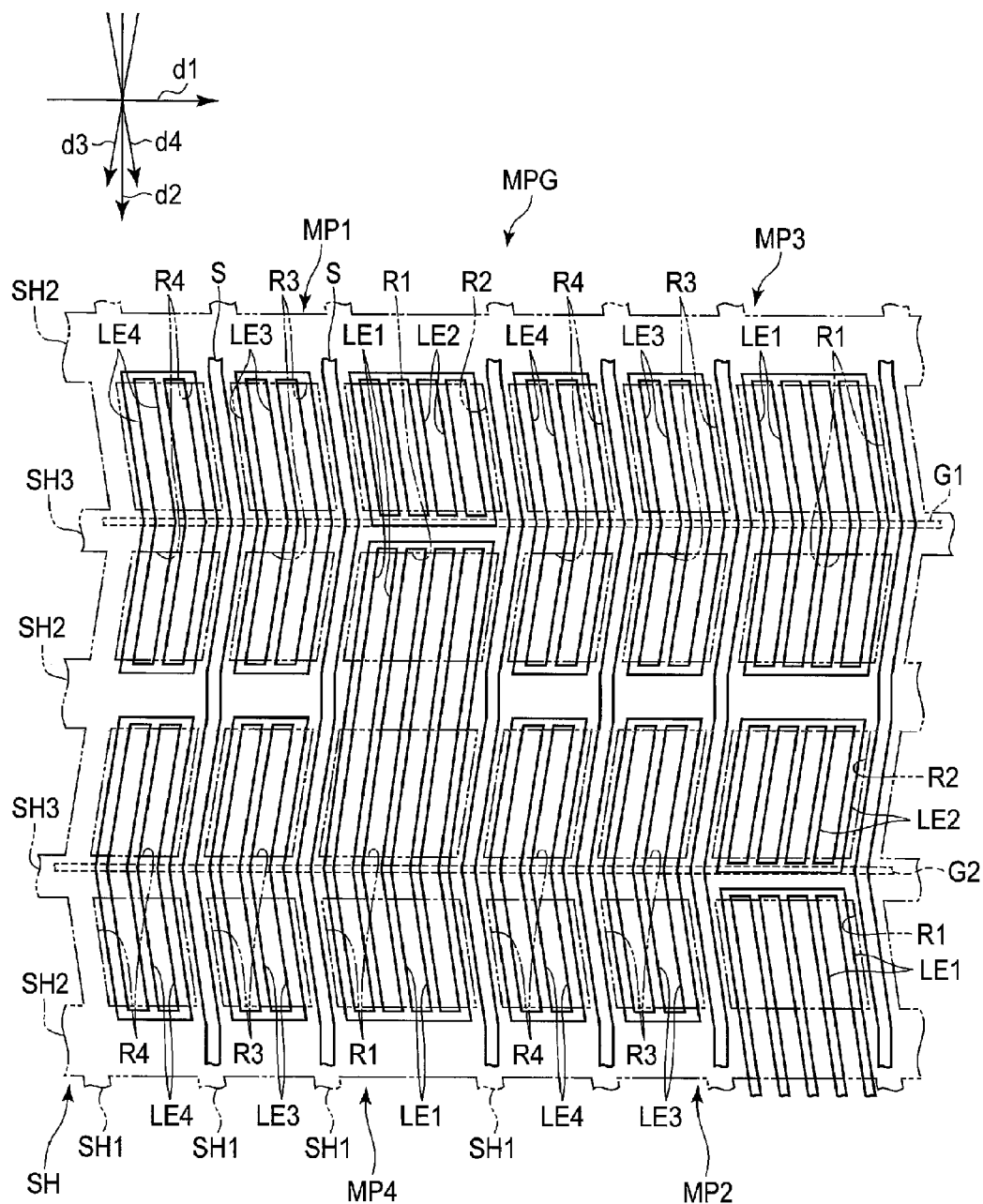
F I G. 16

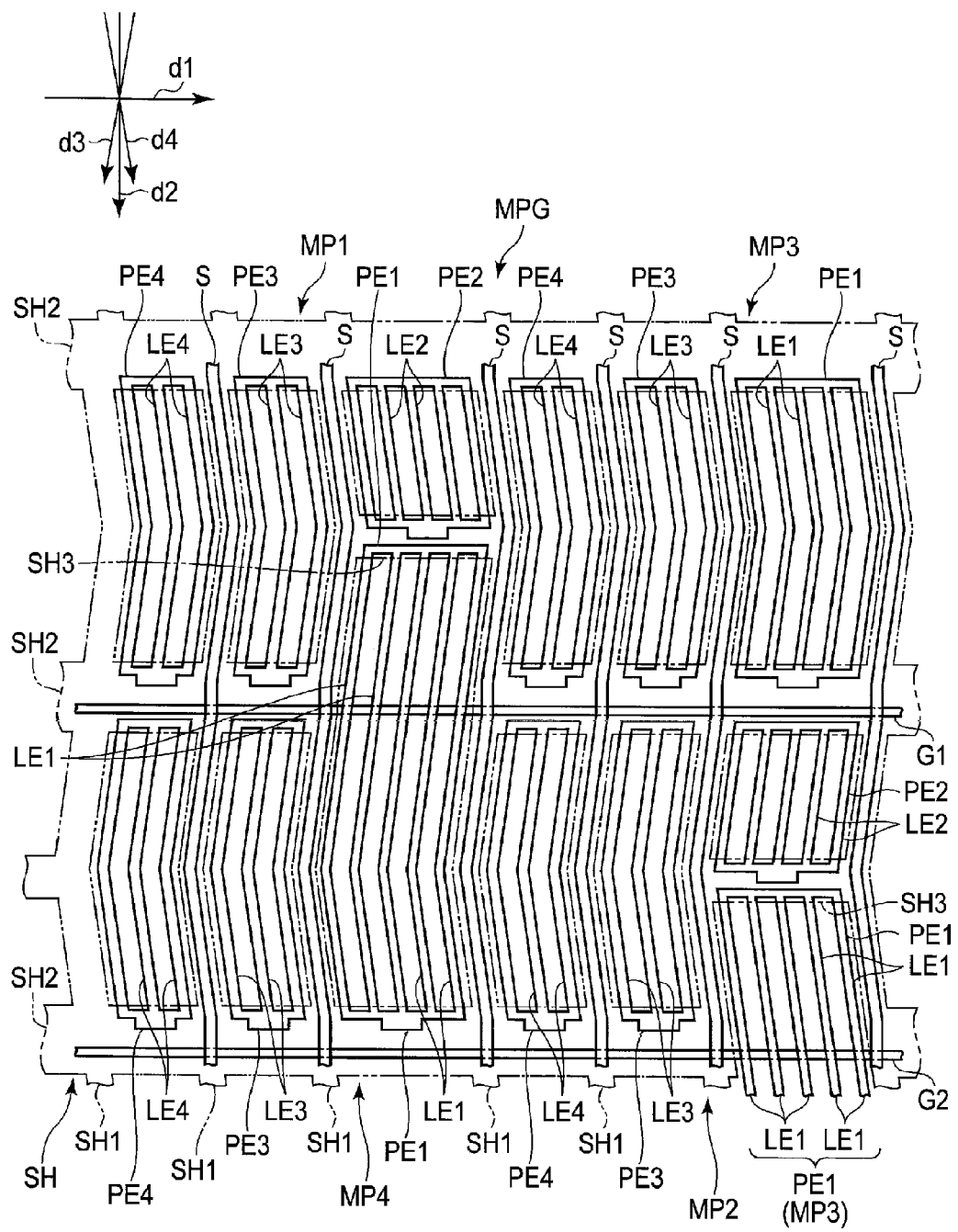
F I G. 17

LIQUID CRYSTAL DISPLAY DEVICE

CROSS-REFERENCE TO RELATED APPLICATIONS

This application is based upon and claims the benefit of priority from Japanese Patent Application No. 2016-074354, filed Apr. 1, 2016, the entire contents of which are incorporated herein by reference.

FIELD

Embodiments described herein relate generally to a liquid crystal display device.

BACKGROUND

In liquid crystal display devices, to obtain high resolution, reduction in the size of pixels is considered. For example, a plurality of pixels are arranged in matrix. Each pixel comprises a plurality of subpixels corresponding to different colors. Each subpixel comprises a pixel electrode and a thin-film transistor connected to the pixel electrode.

Depending on the liquid crystal display device, the direction of an electric field applied to the liquid crystal in a single subpixel (in other words, the direction of alignment of the liquid crystal when an electric field is applied) is classified into one type, two types, four types, etc. If the direction of alignment of the liquid crystal in a single subpixel when an electric field is applied is classified into a plurality of types, the range of viewing angle can be expanded in the liquid crystal display device.

Further, when liquid crystal display devices are manufactured, the dependence of color chromaticity on the viewing angle is preferably considered. For example, if the dependence of color chromaticity on the viewing angle in a horizontal direction is reduced when a liquid crystal display device is perpendicularly provided, the color of the display image can be the same for a user located on the left side of the screen and a user located on the right side of the screen.

BRIEF DESCRIPTION OF THE DRAWINGS

FIG. 3 shows an example of arrangement of a plurality of groups of pixels in a display area of the liquid crystal display panel.

FIG. 5 is a plan view showing the structure of an array substrate shown in FIG. 1 and FIG. 2.

FIG. 10 shows the scanning lines, the signal lines, the pixel electrodes and the light-shielding layer shown in FIG. 6, and is shown for explaining the direction in which each linear electrode of the pixel electrodes extends, and the direction in which each linear electrode intersects with a corresponding scanning line.

FIG. 11 is a plan view shown for explaining a method for manufacturing the array substrate.

FIG. 12 is a plan view shown for explaining the method for manufacturing the array substrate following FIG. 11.

FIG. 15 is a structural diagram showing one of the groups of pixels of the liquid crystal display panel of modification example 2 of the embodiment, and shows the scanning lines, the signal lines, the pixel electrodes and the light-shielding layer.

FIG. 16 is a structural diagram showing one of the groups of pixels of the liquid crystal display panel of modification example 3 of the embodiment, and shows the scanning lines, the signal lines, the pixel electrodes and the light-shielding layer.

FIG. 17 is a structural diagram showing one of the groups of pixels of the liquid crystal display panel of modification example 4 of the embodiment, and shows the scanning lines, the signal lines, the pixel electrodes and the light-shielding layer.

DETAILED DESCRIPTION

Figure 1:
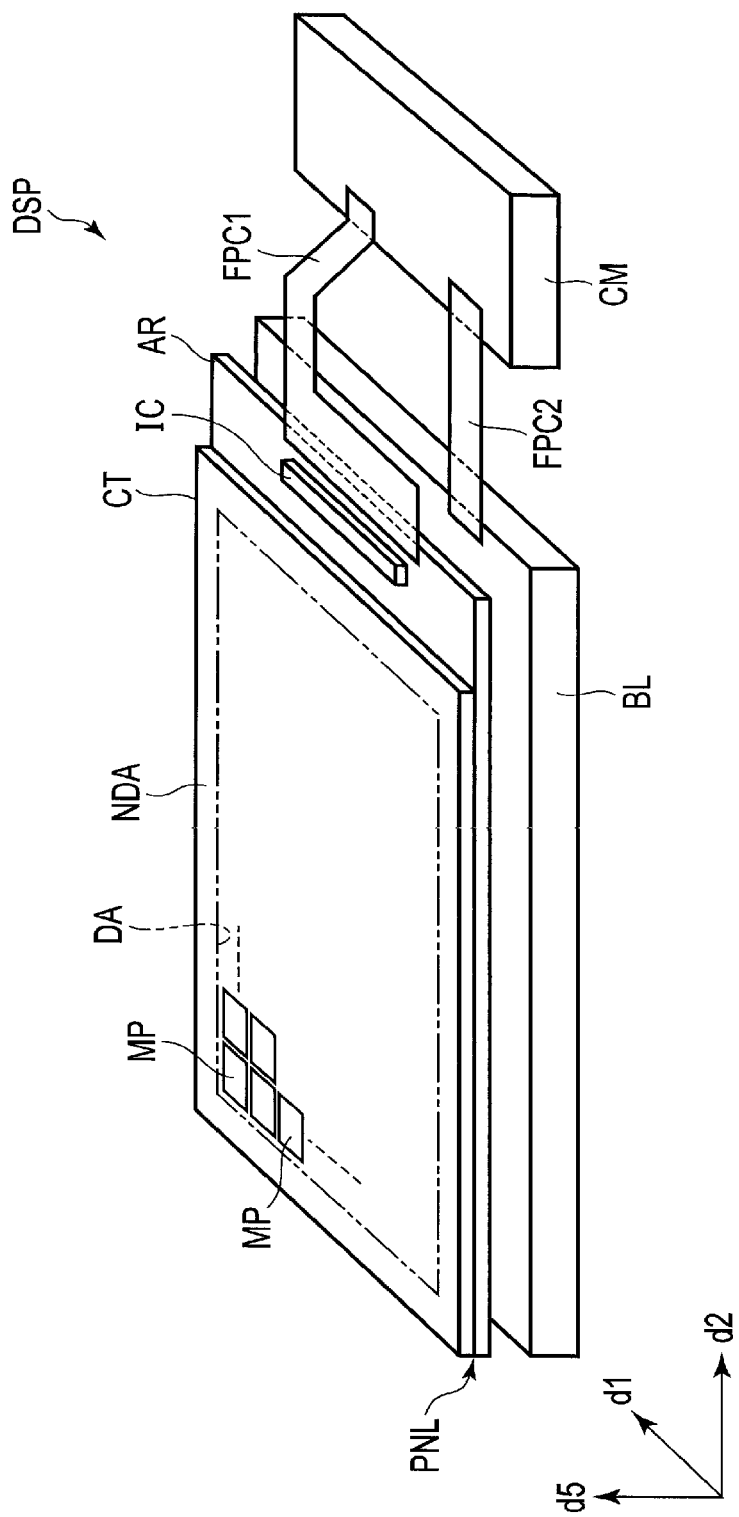
FIG. 1 is a perspective view showing the structure of a liquid crystal display device according to one embodiment.

In general, according to one embodiment, there is provided a liquid crystal display device comprising:

a first scanning line extending in a first direction;

a third scanning line extending in the first direction and being distant from the first scanning line in a second direction perpendicular to the first direction;

a second scanning line extending in the first direction and located between the first scanning line and the third scanning line;

a first linear electrode located between the first scanning line and the second scanning line and extending in a third direction inclined from the second direction at an acute angle in a first rotation direction;

a second linear electrode located between the first scanning line and the second scanning line and extending in a fourth direction inclined from the second direction at an acute angle in a second rotation direction opposite to the first rotation direction; and a third linear electrode located between the second scanning line and the third scanning line and comprising a portion extending in the fourth direction, wherein the second linear electrode is electrically connected to the third linear electrode.

According to another embodiment, there is provided a liquid crystal display device comprising:

a first scanning line extending in a first direction;

a second scanning line extending in the first direction and adjacent to the first scanning line in a second direction so as to be distant from the first scanning line, the second direction being perpendicular to the first direction; and a plurality of groups of pixels in matrix in the first direction and the second direction, wherein each of the groups of pixels comprises a first pixel, a second pixel, a third pixel adjacent to the first pixel in the first direction and adjacent to the second pixel in the second direction, and a fourth pixel adjacent to the second pixel in the first direction and adjacent to the first pixel in the second direction, each of the first to fourth pixels comprises a first color subpixel including a first linear electrode, the first linear electrode of the first pixel and the first linear electrode of the fourth pixel are integrally formed, are electrically connected to each other, and intersect with the first scanning line at a first angle, in the first and fourth pixels adjacent to each other in the second direction across the intervening first scanning line, the first linear electrode of the second pixel and the first linear electrode of the third pixel are integrally formed, are electrically connected to each other, and intersect with the second scanning line at a second angle, in the second and third pixels adjacent to each other in the second direction across the intervening second scanning line, the first angle is an obtuse angle, and is made by a start line along the first scanning line and an end line positioned by rotating around a point on the start line in a first rotation direction, and the second angle is an acute angle, and is made by a start line along the second scanning line and an end line positioned by rotating around a point on the start line in the first rotation direction.

According to another embodiment, there is provided a liquid crystal display device comprising:

a first scanning line extending in a first direction;

a second scanning line extending in the first direction and adjacent to the first scanning line in a second direction so as to be distant from the first scanning line, the second direction being perpendicular to the first direction;

a first pixel comprising a first color subpixel including a first linear electrode, and a second color subpixel including a second linear electrode; and a second pixel comprising a first color subpixel including a first linear electrode, and a second color subpixel including a second linear electrode, wherein the first linear electrode and the second linear electrode are adjacent to each other in the second direction across the intervening first scanning line in the first pixel, the first linear electrode and the second linear electrode are adjacent to each other in the second direction across the intervening second scanning line in the second pixel, and in a plan view where the first and second linear electrodes are located on left and right sides, respectively, or in a plan view where the first and second linear electrodes are located on right and left sides, respectively, in each of the first and second pixels, a pattern of the first and second linear electrodes of the first pixel has a V-shape, and a pattern of the first and second linear electrodes of the second pixel has a shape obtained by vertically inverting the V-shape, the first scanning line intersects with a bend portion of the V-shape, and the second scanning line intersects with a bend portion of the shape obtained by vertically inverting the V-shape.

An embodiment and modification examples will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

Embodiment

This specification explains a liquid crystal display device according to one embodiment, and a method for manufacturing the liquid crystal display device.

The liquid crystal display device may be used for various devices such as a smartphone, a tablet, a mobile phone, a personal computer, a television receiver, an in-vehicle device and a game console.

FIG. 1 is a perspective view showing the structure of a liquid crystal display device DSP. In the present embodiment, a first direction d1 is perpendicular to a second direction d2. A fifth direction d5 is perpendicular to the first direction d1 and the second direction d2. The directions refer to the directions of the arrows shown in the drawings. Directions rotated 180 degrees with respect to the arrows are opposite directions. The first direction d1 may not be perpendicular to the second direction d2.

The liquid crystal display device DSP comprises an active-matrix liquid crystal display panel PNL, a drive IC chip IC provided on the liquid crystal display panel PNL, a backlight unit BL illuminating the liquid crystal display panel PNL, flexible printed circuits FPC1 and FPC2, etc. The flexible printed circuits FPC1 and FPC2 are connected to the liquid crystal display device or a control module CM provided outside the liquid crystal display device.

In the following explanation, the direction from the backlight unit BL to the liquid crystal display panel PNL is referred to as an upward direction, and the direction from the liquid crystal display panel PNL to the backlight unit BL is referred to as a downward direction. When this specification uses the expression "a second member above a first member" or "a second member below a first member", the second member may be in contact with the first member, or may be isolated from the first member. In the latter case, a third member may be interposed between the first member and the second member.

The liquid crystal display panel PNL comprises an array substrate AR, and a counter-substrate CT facing the array substrate AR. The liquid crystal display panel PNL comprises a display area DA displaying an image, and a frame-like non-display area NDA surrounding the display area DA. The liquid crystal display panel PNL comprises a plurality of main pixels arranged in matrix in the first direction d1 and the second direction d2 in the display area DA. In the following explanation, the main pixels are simply referred to as pixels MP. Each pixel MP is equivalent to a group of four subpixels as explained later.

The backlight unit BL is provided on the rear surface of the array substrate AR. Various forms may be applied to the backlight unit BL. The detailed structure is not explained here. The drive IC chip IC is mounted on the array substrate AR. The flexible printed circuit FPC1 connects the liquid crystal display panel PNL and the control module CM. The flexible printed circuit FPC2 connects the backlight unit BL and the control module CM.

The liquid crystal display device DSP having the above structure is equivalent to a transmissive type liquid crystal display device, which displays an image by causing each subpixel to selectively transmit light entering the liquid crystal display panel PNL from the backlight unit BL. However, the liquid crystal display device DSP may be a reflective type liquid crystal display device, which displays an image by causing each subpixel to selectively reflect outside light entering the liquid crystal display panel PNL from outside, or may be a transreflective liquid crystal display device, which comprises both the transmissive function and the reflective function.

Figure 2:
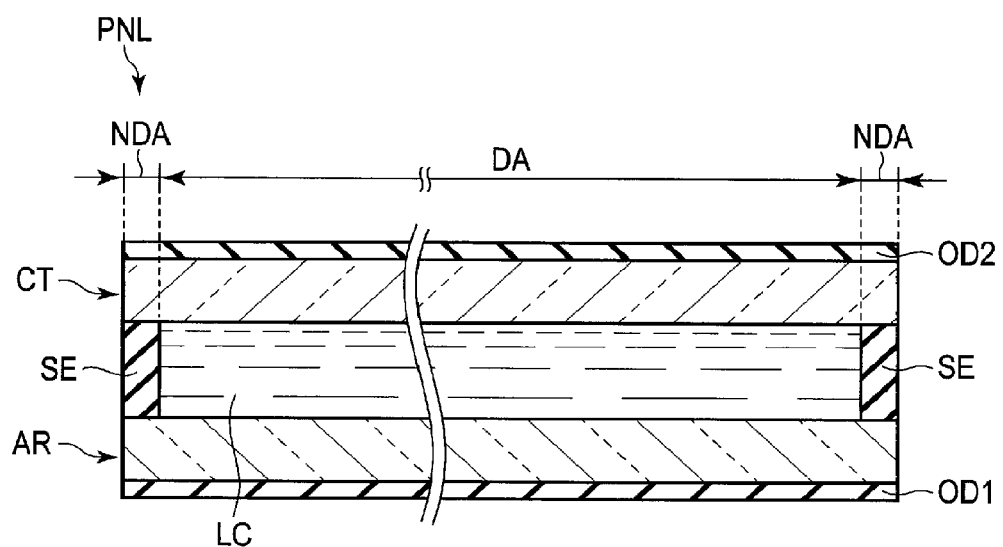
FIG. 2 is a cross-sectional view showing a liquid crystal display panel shown in FIG. 1.

FIG. 2 is a cross-sectional view showing the liquid crystal display panel PNL.

As shown in FIG. 2, the liquid crystal display panel PNL comprises the array substrate AR, the counter-substrate CT, a liquid crystal layer LC, a sealing member SE, a first optical element OD1, a second optical element OD2, etc. The details of the array substrate AR and the counter-substrate CT are explained later.

The sealing member SE is provided in the non-display area NDA, and is used to bond the array substrate AR and the counter-substrate CT. The liquid crystal layer LC is held between the array substrate AR and the counter-substrate CT. The first optical element OD1 is provided on the array substrate AR on a side opposite to the contact surface with the liquid crystal layer LC. The second optical element OD2 is provided on the counter-substrate CT on a side opposite to the contact surface with the liquid crystal layer LC. Each of the first and second optical elements OD1 and OD2 comprises a polarizer. Each of the first and second optical elements OD1 and OD2 may include another optical element such as a retardation film.

FIG. 3 shows an example of arrangement of a plurality of groups of main pixels in the display area DA of the liquid crystal display panel PNL. In the following explanation, the groups of main pixels are simply referred to as groups MPG of pixels.

As shown in FIG. 3, the liquid crystal display panel PNL comprises a plurality of groups MPG of pixels. The groups MPG of pixels are arranged in matrix in the first direction d1 and the second direction d2 in the display area DA. Each group MPG of pixels comprises four main pixels. Here, each group MPG of pixels comprises the following four types of pixels: a first type pixel A, a second type pixel B, a third type pixel C and a fourth type pixel D. In all of the groups MPG of pixels, the first type pixel A, the second type pixel B, the third type pixel C and the fourth type pixel D are arranged in the same manner. The structures of the first type pixel A, the second type pixel B, the third type pixel C and the fourth type pixel D are explained later.

With regard to the pixel units, the pixels are arranged in the first direction d1 so as to alternate the first type pixel A and the third type pixel C in a line and alternate the fourth type pixel D and the second type pixel B in another line. Further, the pixels are arranged in the second direction d2 so as to alternate the first type pixel A and the fourth type pixel D in a line and alternate the third type pixel C and the second type pixel B in another line. The first type pixels A, the second type pixels B, the third type pixels C and the fourth type pixels D are arranged such that the same type pixels are not adjacent to each other in the first direction d1 or the second direction d2.

Figure 4:
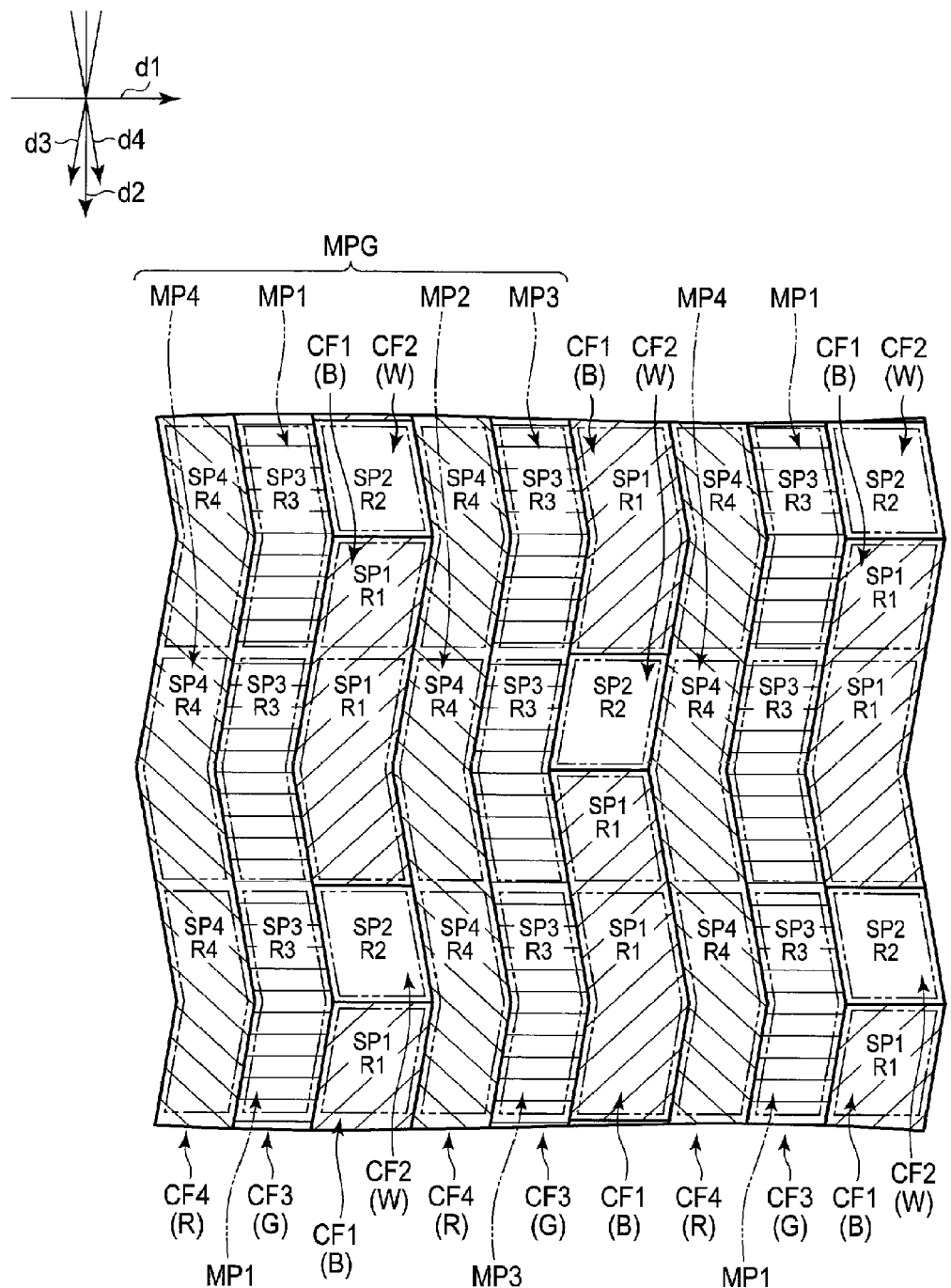
FIG. 4 shows a part of the groups of pixels, and an example of arrangement of the pixels of the groups.

FIG. 4 shows an example of arrangement of a plurality of groups MPG of pixels. FIG. 4 shows the four pixels MP of a group MPG of pixels, and five pixels MP located around the four pixels MP.

As shown in FIG. 4, the group MPG of pixels comprises a first pixel MP1, a second pixel MP2, a third pixel MP3 and a fourth pixel MP4. The first pixel MP1 corresponds to the first type pixel A. The second pixel MP2 corresponds to the second type pixel B. The third pixel MP3 corresponds to the third type pixel C. The fourth pixel MP4 corresponds to the fourth type pixel D.

Each of the first pixel MP1 and the second pixel MP2 comprises the following four subpixels SP: a first color subpixel SP1, a second color subpixel SP2, a third color subpixel SP3 and a fourth color subpixel SP4. Each of the third pixel MP3 and the fourth pixel MP4 comprises the following three subpixels SP: the first color subpixel SP1, the third color subpixel SP3 and the fourth color subpixel SP4. The first color, the second color, the third color and the fourth color are different from each other.

The first color subpixel SP1 of each pixel MP comprises a region R1 displaying the first color, and a color layer CF1 corresponding to the first color. The third color subpixel SP3 of each pixel MP comprises a region R3 displaying the third color, and a color layer CF3 corresponding to the third color. The fourth color subpixel SP4 of each pixel MP comprises a region R4 displaying the fourth color, and a color layer CF4 corresponding to the fourth color. The second color subpixel SP2 of each first pixel MP1 and each second pixel MP2 comprises a region R2 displaying the second color, and a color layer CF2 corresponding to the second color. The regions R1 to R4 are indicated by alternate long and two-dot chain lines in FIG. 4. Each of the regions R1 to R4 may be called the aperture region of a corresponding subpixel SP. Each of the regions R1 to R4 may be also called a region which does not face the light-shielding layer SH described later.

In each of the first and second pixels MP1 and MP2, the regions R1 to R4 are arranged as follows. The region R1 is adjacent to the region R2 in the second direction d2. The region R3 is adjacent to both the region R1 and the region R2 in the first direction d1. The region R3 is interposed between the region R4 and both the region R1 and the region R2. In each of the third and fourth pixels MP3 and MP4, the regions R1, R3 and R4 are arranged as follows. The region R1 is adjacent to the region R3 in the first direction d1. The region R3 is interposed between the region R4 and the region R1.

Both the region R1 and the region R2 of the first pixel MP1 are adjacent to the region R4 of the third pixel MP3 in the first direction d1. The region R1 of the third pixel MP3 is adjacent to, in the first direction d1, the region R4 of the first pixel MP1 of the adjacent group MPG of pixels in the first direction d1. The region R1 of the fourth pixel MP4 is adjacent to the region R4 of the second pixel MP2 in the first direction d1. Both the region R1 and the region R2 of the second pixel MP2 are adjacent to, in the first direction d1, the region R4 of the fourth pixel MP4 of the adjacent group MPG of pixels in the first direction d1.

In the first pixel MP1 and the fourth pixel MP4, the regions R3 are adjacent to each other in the second direction d2, and the regions R4 are adjacent to each other in the second direction d2. This arrangement is also applied to the third pixel MP3 and the second pixel MP2. In the group MPG of pixels, the region R1 of the first pixel MP1 is adjacent to the region R1 of the fourth pixel MP4 in the second direction d2. In the group MPG of pixels, the region R2 of the second pixel MP2 is interposed between the region R1 of the second pixel MP2 and the region R1 of the third pixel MP3 in the second direction d2.

With regard to a pair of groups MPG of pixels adjacent to each other in the second direction d2, the region R2 of the first pixel MP1 of a group MPG of pixels is interposed between the region R1 of the first pixel MP1 of the group MPG of pixels and the region R1 of the fourth pixel MP4 of another group MPG of pixels in the second direction d2. The region R1 of the second pixel MP2 of the other group MPG of pixels is adjacent to the region R1 of the third pixel MP3 of the group MPG of pixels in the second direction d2.

The shape of each region R2, the region R1 of the first pixel MP1 and the region R1 of the second pixel MP2 is substantially a parallelogram. In a plan view where the second and fourth pixels MP2 and MP4 are located on the left side in a group MPG of pixels, and the first and third pixels MP1 and MP3 are located on the right side, the pattern formed by the combination of the regions R1 and R2 of the first pixel MP1 (hereinafter, the integral shape of two regions is referred to as a pattern), the region R3 of the first pixel MP1 and the region R4 of the first pixel MP1 each have a V-shape (in other words, a shape projecting in a downward direction substantially in the center). In the above plan view, each of the regions R1, R3 and R4 of the third pixel MP3 has a V-shape.

In the above plan view, the pattern of the regions R1 and R2 of the second pixel MP2, the region R3 of the second pixel MP2 and the region R4 of the second pixel MP2 each have a shape obtained by vertically inverting a V-shape (in other words, a shape projecting in an upward direction substantially in the center; a λ-shape). In the above plan view, each of the regions R1, R3 and R4 of the fourth pixel MP4 has a λ-shape.

In FIG. 4, a V-shape may be referred to as a shape projecting in the first direction d1. A λ-shape may be referred to as a shape depressed in the first direction d1.

The color layers CF1 to CF4 are arranged in accordance with the above layout of the subpixels SP, and have areas based on the sizes of the respective subpixels SP. The color layers CF1 and the color layers CF2 are alternately arranged in the second direction d2. Each color layer CF1 faces two regions R1 adjacent to each other in the second direction d2, and extends along the two regions R1. The color layers CF2 face the respective regions R2. Each color layer CF3 faces a plurality of regions R3 arranged in the second direction d2, and extends along the regions R3. Each color layer CF4 faces a plurality of regions R4 arranged in the second direction d2, and extends along the regions R4.

In the present embodiment, the first, second, third and fourth colors are blue (B), white (W), green (G) and red (R), respectively. For example, the color layer CF2 is a transparent or tinted layer. The color layer CF2 is substantially transparent, and may be called an uncolored layer depending on the case. Note that, the first to fourth colors are not limited to the above examples, and may be modified in various ways. Any one of the first to fourth colors should be blue. Another one should be white. Yet another one should be green. The remaining one should be red. Further, the above first to fourth colors are not limited to the combination of blue, white, green and red. The second color and the color layer CF2 may not be white, and further may be different from blue, green and red.

In this specification, for example, light having a wavelength in a range of 380 to 780 nm is defined as visible light. The light of the first color is blue light, and is defined as light having a wavelength greater than or equal to 380 nm and less than 490 nm. The light of the second color is white light. The light of the third color is green light, and is defined as light having a wavelength greater than or equal to 490 nm and less than 590 nm. The light of the fourth color is red light, and is defined as light greater than or equal to 590 nm and less than 780 nm. When an element is substantially transparent, the element may be uncolored, or may be tinted with any color of visible light.

Each of the regions R3 and R4 of each pixel MP, pattern of the regions R1 and R2 of each of the first and second pixels MP1 and MP2, and region R1 of each of the third and fourth pixels MP3 and MP4 have substantially the same length in the second direction d2.

Each region R1 and each region R2 have approximately the same first width in the first direction d1. Each region R3 and each region R4 have approximately the same second width in the first direction d1. The first width is greater than the second width.

The regions R3 and R4 of each pixel MP have approximately the same first area. Each of the regions R1 and R2 of the first pixel MP1 and each of the regions R1 and R2 of the second pixel MP2 have approximately the same second area. The region R1 of the third pixel MP3 and the region R1 of the fourth pixel MP4 have approximately the same third area. The second area is less than the first area. The third area is greater than the first area.

The areas of the regions R1 to R4 are not limited to the above examples. For example, the regions R1 and R2 may have different areas. The regions R3 and R4 may have different areas.

When the pixels MP have the above structures, the number of subpixels SP of each group MPG of pixels can be reduced in comparison with a case where every pixel MP comprises four subpixels such as red (R), green (G), blue (B) and white (W) subpixels. In this manner, it is possible to improve the aperture ratio of subpixels SP without substantially decreasing the resolution. Since each group MPG of pixels comprises white (W) subpixels SP, the brightness of the display image can be improved.

Each region R1, each pattern of the regions R1 and R2, each region R3 and each region R4 have a V-shape, etc., as described above. Each region R or each color layer extends in at least one of third and fourth directions d3 and d4. The third direction d3 is a direction inclined from the second direction d2 at an acute angle in a first rotation direction. The fourth direction d4 is a direction inclined from the second direction d2 at an acute angle in a second rotation direction opposite to the first rotation direction. In the present embodiment, the first rotation direction is clockwise, and the second rotation direction is counterclockwise. However, in a manner different from that of the present embodiment, the first rotation direction may be counterclockwise, and the second rotation direction may be clockwise.

Because of the above structure, the present embodiment can ensure the viewing angle characteristics in comparison with a case where the above regions have a rectangular shape extending in the second direction d2. Thus, the viewing angle on the liquid crystal display panel PNL can be increased.

In each group MPG of pixels, the total area of four regions R1, the total area of four regions R3 and the total area of four regions R4 are approximately the same. At least one of the third and fourth pixels MP3 and PM4 can offset the shortage of the first color (blue) in the first and second pixels MP1 and MP2. Thus, each pixel MP can display a color image in a pseudo manner. The area of the region R2 of the first pixel MP1 is approximately the same as that of the region R2 of the second pixel MP2.

In other words, in the first to fourth pixels MP1 to MP4 of each group MPG of pixels, the total area of the regions in which all of the first color subpixels SP1 display the first color, the total area of the regions in which all of the third color subpixels SP3 display the third color and the total area of the regions in which all of the fourth color subpixels SP4 display the fourth color are the same. The area of the region in which the second color subpixel SP2 of the first pixel MP1 displays the second color is the same as that of the region in which the second color subpixel SP2 of the second pixel MP2 displays the second color. To adjust the color chromaticity or the aperture ratio in connection with the provision of spacers, the total area of four regions R1, the total area of four regions R3 and the total area of four regions R4 may be different from each other.

In the regions R1, R3 and R4 having the first area (middle-sized area) or the third area (large area), the direction of alignment of liquid crystal molecules by an electric field is categorized into a plurality of types. The number of types of direction of alignment of liquid crystal molecules by an electric field in the regions R1 and R2 having the second area (small area) is less than that in the above middle-sized or large regions. However, the combination of two regions R1 having the second area (small area) in each group MPG of pixels has the same number of types of direction of alignment of liquid crystal molecules by an electric field as the above middle-sized or large regions. Similarly, the combination of two regions R2 having the second area (small area) in each group MPG of pixels has the same number of types of direction of alignment of liquid crystal molecules by an electric field as the above middle-sized or large regions.

For example, as seen in plan view, the direction of alignment of liquid crystal molecules by an electric field in the region R2 of the first pixel MP1 and the direction of alignment of liquid crystal molecules by an electric field in the region R2 of the second pixel MP2 can be symmetrical with respect to the axis of the second direction d2. Thus, it is possible to reduce the dependence of color chromaticity on the viewing angle in the first direction d1 (horizontal direction). The color of the display image can be the same for a user located on the left side of the screen and a user located on the right side of the screen.

In the present embodiment, as explained later, the same pixel electrode is provided for the first color subpixel SP1 of the first pixel MP1 and the first color subpixel SP1 of the fourth pixel MP4 to perform display with the same gradation. The same pixel electrode is provided for the first color subpixel SP1 of the second pixel MP2 and the first color subpixel SP1 of the third pixel MP3 of the adjacent group MPG of pixels in the second direction d2 to perform display with the same gradation. Thus, the first color subpixel SP1 of the first pixel MP1 of the present embodiment may be defined as a part of the first color subpixel SP1 of the fourth pixel MP4. The first color subpixel SP1 of the second pixel MP2 of the present embodiment may be defined as a part of the first color subpixel SP1 of the third pixel MP3 of the adjacent group MGP of pixels in the second direction d2.

FIG. 5 is a plan view showing the structure of the array substrate AR.

As shown in FIG. 5, the array substrate AR comprises scanning lines G, signal lines S, pixel electrodes PE, switching elements SW, a first drive circuit DR1, a second drive circuit DR2, etc.

In the display area DA, the scanning lines G extend in the first direction d1 and are arranged at intervals in the second direction d2. In the present embodiment, the scanning lines G linearly extend in the first direction d1. In the display area DA, the signal lines S extend in the second direction d2, intersect with the scanning lines G and are arranged at intervals in the first direction d1. The signal lines S may not linearly extend. The signal lines S may be partially bent or extend in a direction intersecting with the first and second directions d1 and d2. In the present embodiment, the signal lines S are bent and extend in the third and fourth directions d3 and d4.

The first drive circuit DR1 and the second drive circuit DR2 are provided in the non-display area NDA. The first drive circuit DR1 is electrically connected to the scanning lines G extended to the non-display area NDA. The second drive circuit DR2 is electrically connected to the signal lines S extended to the non-display area NDA. The first drive circuit DR1 outputs a control signal to each scanning line G. The second drive circuit DR2 outputs an image signal (for example, a video signal) to each signal line S.

The first color subpixel SP1 of each pixel MP includes a first pixel electrode PE1 electrically connected to the signal line S via a first switching element SW1 connected to the scanning line G. Each second color subpixel SP2 of the first and second pixels MP1 and MP2 includes a second pixel electrode PE2 electrically connected to the signal line S via a second switching element SW2 connected to the scanning line G. The third color subpixel SP3 of each pixel MP includes a third pixel electrode PE3 electrically connected to the signal line S via a third switching element SW3 connected to the scanning line G. The fourth color subpixel SP4 of each pixel MP includes a fourth pixel electrode PE4 electrically connected to the signal line S via a fourth switching element SW4 connected to the scanning line G.

In each group MPG of pixels, the first pixel electrode PE1 of the first pixel MP1 and the first pixel electrode PE1 of the fourth pixel MP4 are adjacent to each other in the second direction d2 across the intervening scanning line G, and are electrically connected to each other. Thus, in each group MPG of pixels, the first color subpixel SP1 of the first pixel MP1 shares the first switching element SW1 with the first color subpixel SP1 of the fourth pixel MP4.

In two adjacent groups MPG of pixels in the second direction d2, the first pixel electrode PE1 of the second pixel MP2 of a group MPG of pixels and the first pixel electrode PE1 of the third pixel MP3 of another group MPG of pixels are adjacent to each other in the second direction d2 across the intervening scanning line G, and are electrically connected to each other. Thus, in the two groups MPG of pixels, the first color subpixel SP1 of the second pixel MP2 of the group MPG of pixels shares the first switching element SW1 with the first color subpixel SP1 of the third pixel MP3 of the other group MPG of pixels.

In the first pixel MP1, the second pixel electrode PE2 is electrically connected to the signal line S via a first line W1, a second line W2, and the second switching element SW2. This structure is also applied to the second pixel MP2.

Of the scanning lines G, the scanning line G located at an end so as to be closest to the second drive circuit DR2 is connected to the first switching elements SW1 connected to the first pixel electrodes PE1 of the second pixels MP2. Thus, the number of scanning lines G is greater than the number of pixels MP arranged in the second direction d2 by one.

Now, this specification explains a first scanning line G1, a second scanning line G2 and a third scanning line G3 in relation to the group MPG of pixels located in the upper left corner portion of the display area DA in FIG. 5. The third scanning line G3 is located at some point distant from the first scanning line G1 in the second direction d2. The second scanning line G2 is located between the first scanning line G1 and the third scanning line G3.

The first color subpixel SP1 of the first pixel MP1 includes the first pixel electrode PE1 electrically connected to the signal line S via the first switching element SW1 connected to the second scanning line G2. The first color subpixel SP1 of the second pixel MP2 includes the first pixel electrode PE1 electrically connected to the signal line S via the first switching element SW1 connected to the third scanning line G3. The first pixel electrode PE1 of the second pixel MP2 is located between the first scanning line G1 and the second scanning line G2. The first scanning line G1 is located between the first pixel electrode PE1 of the first pixel MP1 and the first pixel electrode PE1 of the second pixel M22.

The second color subpixel SP2 of the first pixel MP1 includes the first line W1, the second line W2, the second switching element SW2 connected to the first scanning line G1, and the second pixel electrode PE2. The second color subpixel SP2 of the second pixel MP2 includes the first line W1, the second line W2, the second switching element SW2 connected to the second scanning line G2, and the second pixel electrode PE2. The first pixel electrode PE1 of the first pixel MP1 is located between the second pixel electrode PE2 of the first pixel M21 and the first scanning line G1. The first pixel electrode PE1 of the second pixel MP2 is located between the second pixel electrode PE2 of the second pixel MP2 and the second scanning line G2.

The first color subpixel SP1 of the third pixel MP3 includes the first pixel electrode PE1 electrically connected to the signal line S via the first switching element SW1 connected to the first scanning line G1. The first color subpixel SP1 of the fourth pixel MP4 includes the first pixel electrode PE1 electrically connected to the signal line S via the first switching element SW1 connected to the second scanning line G2.

The first pixel electrode PE1 of the first pixel MP1 and the first pixel electrode PE1 of the fourth pixel MP4 are integrally formed, and are electrically connected to each other. The first switching element SW1 connected to the first pixel electrode PE1 of the first pixel MP1 is the first switching element SW1 connected to the first pixel electrode PE1 of the fourth pixel MP4. Thus, the first pixel MP1 shares a single first switching element SW1 with the fourth pixel MP4.

Figure 6:
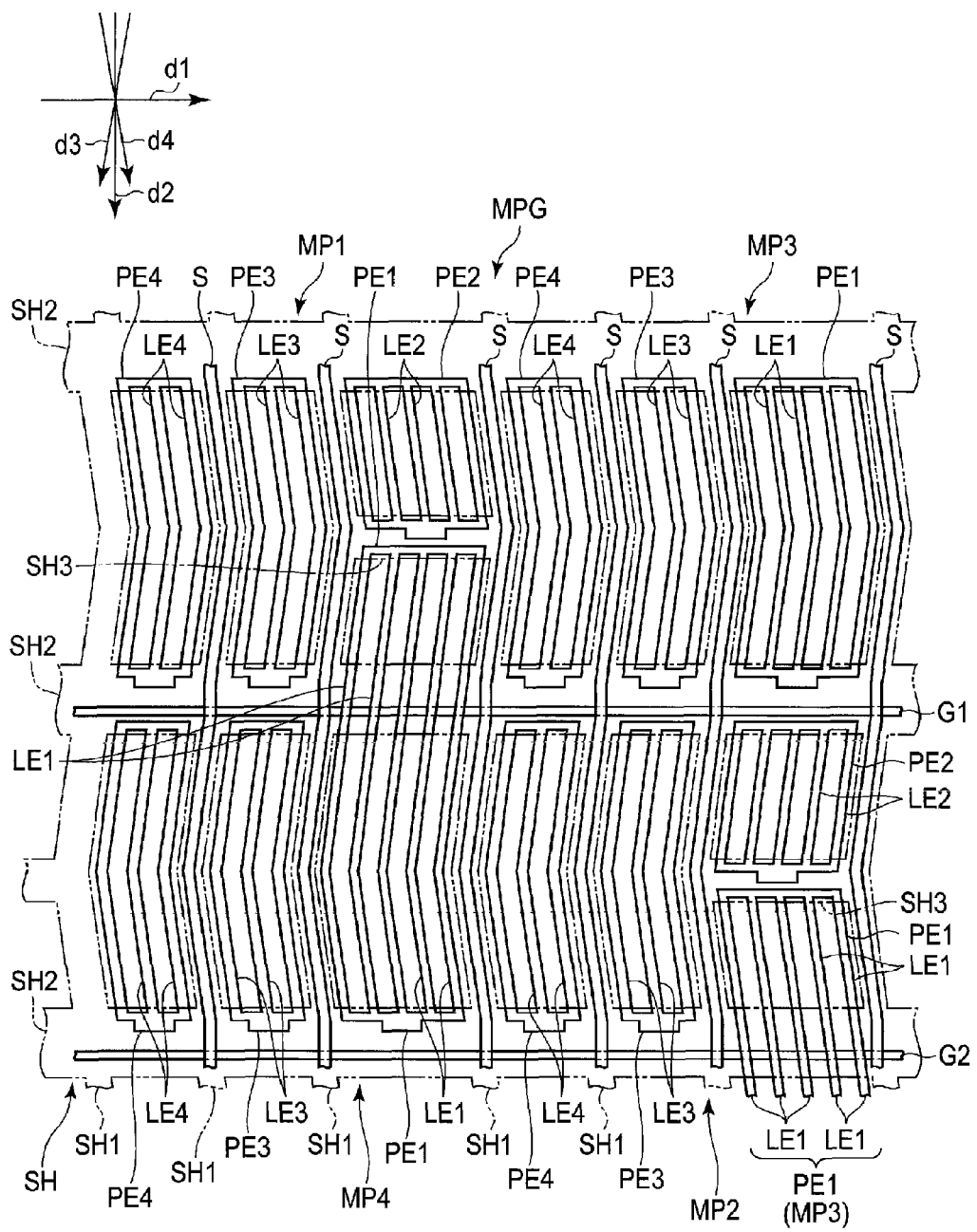
FIG. 6 is a structural diagram showing one of the groups of pixels of the liquid crystal display panel, and shows scanning lines, signal lines, pixel electrodes and a light-shielding layer.

FIG. 6 is a structural diagram showing one of the groups MPG of pixels of the liquid crystal display panel PNL, and shows the scanning lines G, the signal lines S, the pixel electrodes PE and the light-shielding layer SH.

In the example shown in FIG. 6, each pixel MP has a structure corresponding to a fringe field switching (FFS) mode as a display mode. However, the common electrode is omitted in FIG. 6. The scanning lines G and the signal lines S are formed on the array substrate. The light-shielding layer SH is formed on the counter-substrate. The light-shielding layer SH is indicated by alternate long and two-dot chain lines in FIG. 6.

As shown in FIG. 6, the light-shielding layer SH is shaped along the border of each subpixel SP. The light-shielding layer SH has a function for at least blocking the light emitted from the backlight unit BL. The light-shielding layer SH is formed of a material in which the optical absorptance is high, such as black resin. Alternatively, the light-shielding layer SH is formed of a material in which the optical reflectance is high, such as metal. The regions surrounded by the light-shielding layer SH are the regions R1 to R4 and contribute to display. The light-shielding layer SH comprises a plurality of first extension portions SH1 having a band-shape, a plurality of second extension portions SH2 having a band-shape, and a plurality of third extension portions SH3 having a strip-shape. In the present embodiment, the first, second and third extension portions SH1, SH2 and SH3 are integrally formed.

The first extension portions SH1 face the signal lines S, and extend along the signal lines S.

The second light-shielding layers SH2 extend in the first direction d1 along the scanning lines G. The second light-shielding layers SH2 face the scanning lines G, the end portions of the pixel electrodes PE, the switching elements SW, etc.

The third extension portions SH3 are located in regions which do not face the scanning lines G. The third extension portions SH3 extend in the first direction d1. One of the third extension portions SH3 is located between the first and second pixel electrodes PE1 and PE2 of the first pixel MP1, and faces the end portions of the first and second pixel electrodes PE1 and PE2. Another third extension portion SH3 is located between the first and second pixel electrodes PE1 and PE2 of the second pixel MP2, and faces the end portions of the first and second pixel electrodes PE1 and PE2.

The first color subpixel SP1 comprises one or more first linear electrodes LE1. The second color subpixel SP2 comprises one or more second linear electrodes LE2. The third color subpixel SP3 comprises one or more third linear electrodes LE3. The fourth color subpixel SP4 comprises one or more fourth linear electrodes LE4. As described later, in the present embodiment, the common electrodes are located below the pixel electrodes PE. Thus, each pixel electrode PE has the linear electrodes LE. When the pixel electrodes PE are located below the common electrodes, each common electrode has the linear electrodes, and each pixel electrode PE has a plate-shape.

In the present embodiment, the first pixel electrode PE1 comprises the first linear electrodes LE1. The second pixel electrode PE2 comprises the second linear electrodes LE2. The third pixel electrode PE3 comprises the third linear electrodes LE3. The fourth pixel electrode PE4 comprises the fourth linear electrodes LE4. For example, the number of linear electrodes LE in the first and second pixel electrodes PE1 and PE2 is greater than that in the third and fourth pixel electrodes PE3 and PE4. However, the number of linear electrodes LE in the first and second pixel electrodes PE1 and PE2 may be the same as that in the third and fourth pixel electrodes PE3 and PE4.

The first linear electrodes LE1 of the first pixel MP1 extend in the third direction d3. The second linear electrodes LE2 of the first pixel MP1 extend in the fourth direction d4. The first linear electrodes LE1 of the second pixel MP2 extend in the fourth direction d4. The second linear electrodes LE2 of the second pixel MP2 extend in the third direction d3.

The third linear electrodes LE3 of the first pixel MP1, the fourth linear electrodes LE4 of the first pixel MP1, the first linear electrodes LE1 of the third pixel MP3, the third linear electrodes LE3 of the third pixel MP3 and the fourth linear electrodes LE4 of the third pixel MP3 extend in the third direction d3 in regions adjacent to the first linear electrodes LE1 of the first pixel MP1 in the first direction d1, and extend in the fourth direction d4 in regions adjacent to the second linear electrodes LE2 of the first pixel MP1 in the first direction d1.

The third linear electrodes LE3 of the second pixel MP2, the fourth linear electrodes LE4 of the second pixel MP2, the first linear electrodes LE1 of the fourth pixel MP4, the third linear electrodes LE3 of the fourth pixel MP4 and the fourth linear electrodes LE4 of the fourth pixel MP4 extend in the fourth direction d4 in a region adjacent to the first linear electrodes LE1 of the second pixel MP2 in the first direction d1, and extend in the third direction d3 in a region adjacent to the second linear electrodes LE2 of the second pixel MP2 in the first direction d1.

The first linear electrodes LE1 of the first pixel MP1 and the first linear electrodes LE1 of the fourth pixel MP4 are integrally formed, and are electrically connected to each other. The first linear electrodes LE1 of the second pixel MP2 and the first linear electrodes LE1 of the third pixel MP3 of the adjacent group of pixels in the second direction d2 are integrally formed, and are electrically connected to each other.

In other words, the first linear electrodes LE1 adjacent to each other in the second direction d2 across the intervening first scanning line G1 are integrally formed, and are electrically connected to each other. The first linear electrodes LE1 adjacent to each other in the second direction d2 across the intervening second scanning line G2 are integrally formed, and are electrically connected to each other. Moreover, the first linear electrodes LE1 overlap the scanning lines.

In a plan view where the first scanning line G1 is located on the right side, and the second scanning line G2 (third scanning line G3) is located on the left side, the patterns of the first and second linear electrodes LE1 and LE2 of the first pixel MP1, the third linear electrodes LE3 of the first pixel MP1, the fourth linear electrodes LE4 of the first pixel MP1, the first linear electrodes LE1 of the third pixel MP3, the third linear electrodes LE3 of the third pixel MP3 and the fourth linear electrodes LE4 of the third pixel MP3 each have a V-shape.

In the above plan view, the patterns of the first and second linear electrodes LE1 and LE2 of the second pixel MP2, the third linear electrodes LE3 of the second pixel MP2, the fourth linear electrodes LE4 of the second pixel MP2, the first linear electrodes LE1 of the fourth pixel MP4, the third linear electrodes LE3 of the fourth pixel MP4 and the fourth linear electrodes LE4 of the fourth pixel MP4 each have a $\lambda$-shape.

In a manner different from that of the present embodiment, the above patterns of the linear electrodes LE and the linear electrodes LE may have the above shapes in a plan view where the first scanning line G1 is located on the left side, and the second scanning line G2 (third scanning line G3) is located on the right side.

Figure 7:
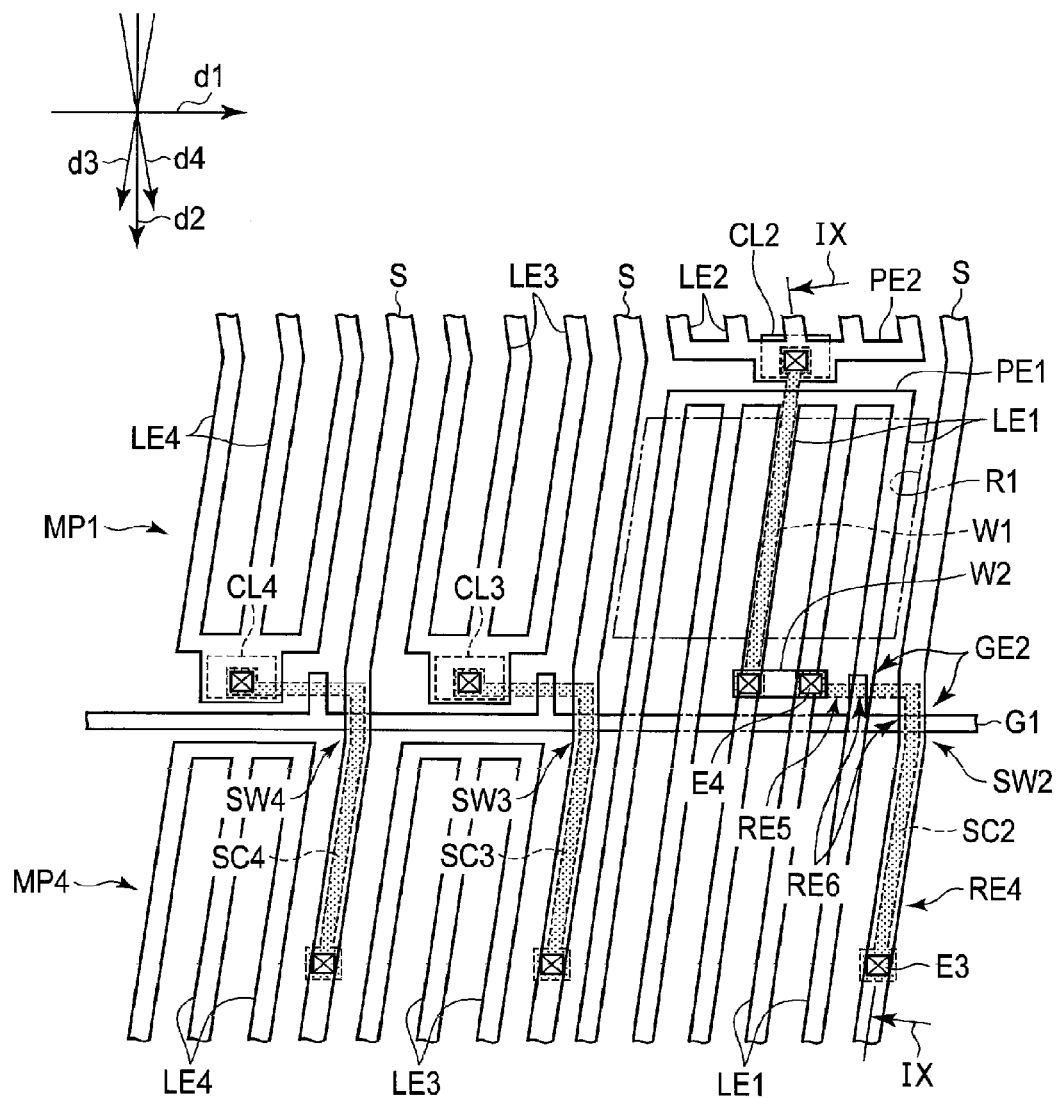
FIG. 7 is an enlarged plan view showing a part of two of the pixels shown in FIG. 6.

FIG. 7 is an enlarged plan view showing a part of two of the pixels MP shown in FIG. 6. FIG. 7 shows the first pixel MP1 and the fourth pixel MP4.

As shown in FIG. 7, each subpixel SP comprises a conductive layer CL. The second subpixel SP2 comprises a conductive layer CL2. The third subpixel SP3 comprises a conductive layer CL3. The fourth subpixel SP4 comprises a conductive layer CL4.

Each switching element SW comprises a semiconductor layer SC. Each semiconductor layer SC intersects with the scanning line G at two positions. Thus, each switching element SW is formed by a double-gate thin-film transistor. The second switching element SW2 comprises a second semiconductor layer SC2. The third switching element SW3 comprises a third semiconductor layer SC3. The fourth switching element SW4 comprises a fourth semiconductor layer SC4.

The second switching element SW2 is a second thin-film transistor, and comprises the second semiconductor layer SC2, at least one second gate electrode GE2, a third electrode E3 and a fourth electrode E4. The second semiconductor layer SC2 comprises a fourth region RE4, a fifth region RE5, and at least one sixth region RE6 located between the fourth region RE4 and the fifth region RE5. In the present embodiment, the second semiconductor layer SC2 comprises two sixth regions RE6.

The second gate electrodes GE2 are a part of the first scanning line G1, and face the sixth regions RE6. In the present embodiment, one of the second gate electrodes GE2 uses the main line portion of the first scanning line G1. Another one of the second gate electrodes GE2 uses a projection portion which projects from the main line portion. The third electrode E3 connects the fourth region RE4 and the signal line S. The fourth electrode E4 is connected to the fifth region RE5.

The first line W1 is formed of the same material as the semiconductor layer SC. The first line W1 is connected to the second pixel electrode PE2, and extends through the region (R1) facing the first pixel electrode PE1 toward the first scanning line G1 side. The first line W1 is located at some point distant from the second semiconductor layer SC2.

In the present embodiment, the material of the semiconductor layer SC and the first line W1 is polycrystalline silicon. In the present embodiment, the impurity concentration of the first line W1 is the same as that of each of the fourth and fifth regions RE4 and RE5 of the second semiconductor layer SC2. However, the impurity concentration of the first line W1 may be higher than that of each of the fourth and fifth regions RE4 and RE5 of the second semiconductor layer SC2. When the impurity concentration of the first line W1 is higher than that of each of the fourth and fifth regions RE4 and RE5, the electrical conductivity of the first line W1 can be higher than that of each of the fourth and fifth regions RE4 and RE5.

The first line W1 preferably faces one of the first linear electrodes LE1 and extends along the first linear electrodes LE1. The first linear electrodes LE1 are phototransmissive. However, the first linear electrodes LE1 do not completely transmit light. Thus, the first line W1 is formed in a region in which the modulation factor of light (polarized light) is less, and the transmittance of light (polarized light) is substantially less, such as the region facing any first linear electrode LE1. When the first line W1 extends along the first linear electrodes LE1, the first line W1 may overlap one of the first linear electrodes LE1, or may be provided between the first linear electrodes LE1. In a manner different from that of the present embodiment, the first line W1 may not face any first linear electrode LE1. The first line W1 may not extend along the first linear electrodes LE1.

The second line W2 connects the first line W1 and the fourth electrode E4. In the present embodiment, the second line W2 and the signal line S are formed of the same material. However, the second line W2 should be located in a layer above the scanning line G. The second line W2 may be located in a layer of a different level from the layer of the signal line S. Both the fifth area RE5 of the second semiconductor layer SC2 and the second line W2 are closer to the second pixel electrode PE2 than the first scanning line G1. The second line W2 extends along the first scanning line G1 and overlaps the light-shielding layer SH. Thus, the second line W2 is provided such that the area of the region R1 is not reduced. For example, when the second line W2 extends in the second direction d2, the area of the region R1 may be reduced, or the second line W2 may extend into the region R1.

Figure 8:
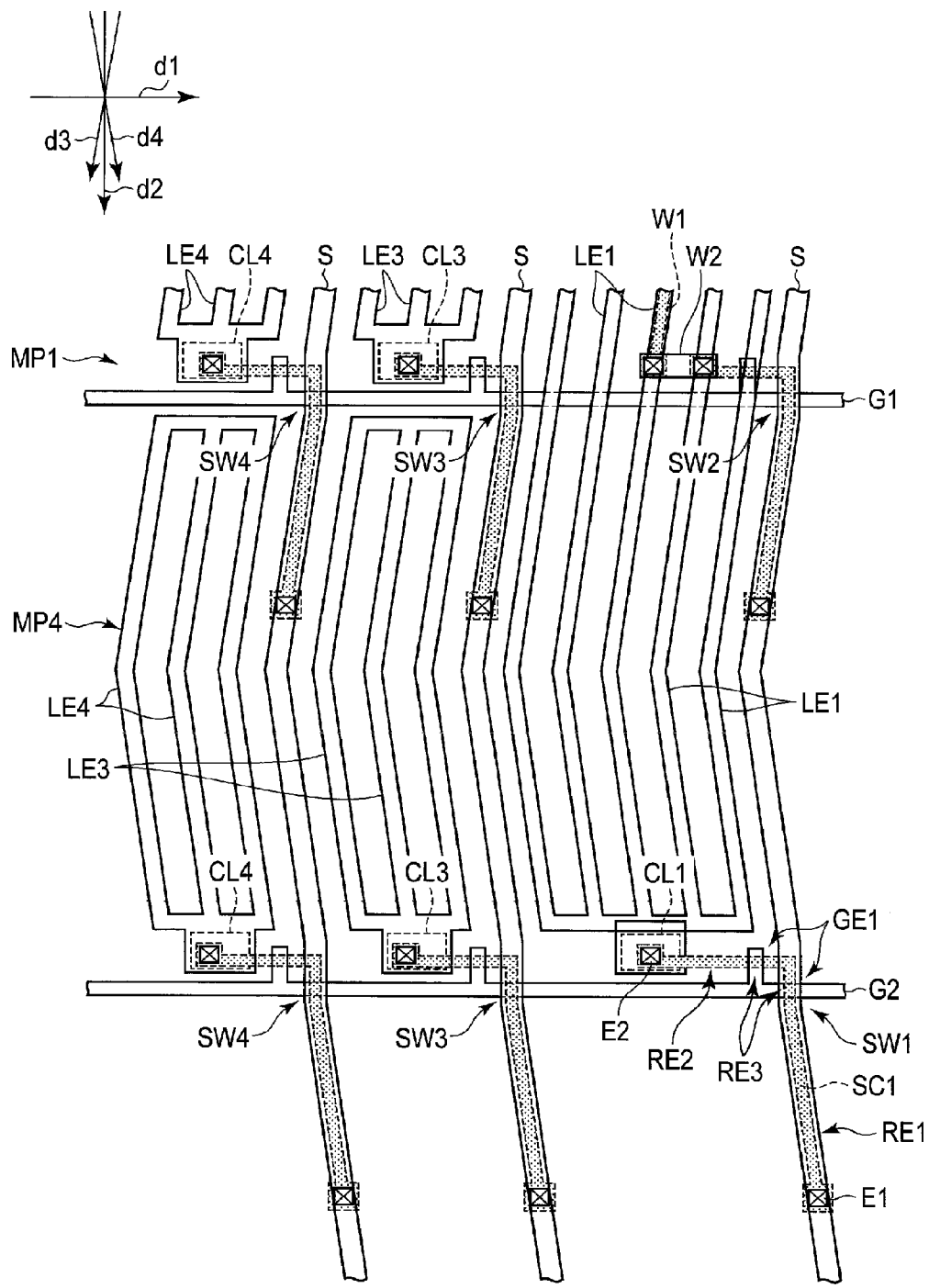
FIG. 8 is an enlarged plan view showing a part of two other pixels.

FIG. 8 is an enlarged plan view showing a part of two other pixels MP.

As shown in FIG. 8, the first subpixel SP1 comprises a conductive layer CL1. The first switching element SW1 comprises a first semiconductor layer SC1.

The first switching element SW1 is a first thin-film transistor, and comprises the first semiconductor layer SC1, at least one first gate electrode GE1, a first electrode E1 and a second electrode E2. The first semiconductor layer SC1 comprises a first region RE1, a second region RE2, and at least one third region RE3 located between the first region RE1 and the second region RE2. In the present embodiment, the first semiconductor layer SC1 comprises two third regions RE3.

The first gate electrodes GE1 are connected to the second scanning line G2, and face the third regions RE3. In the present embodiment, one of the first gate electrodes GE1 uses the main line portion of the second scanning line G2. Another one of the first gate electrodes GE1 uses a projection portion which projects from the main line portion. The first electrode E1 connects the first region RE1 and the signal line S. The second electrode E2 connects the second region RE2 and the conductive layer CL1 (first pixel electrode PE1).

Figure 9:
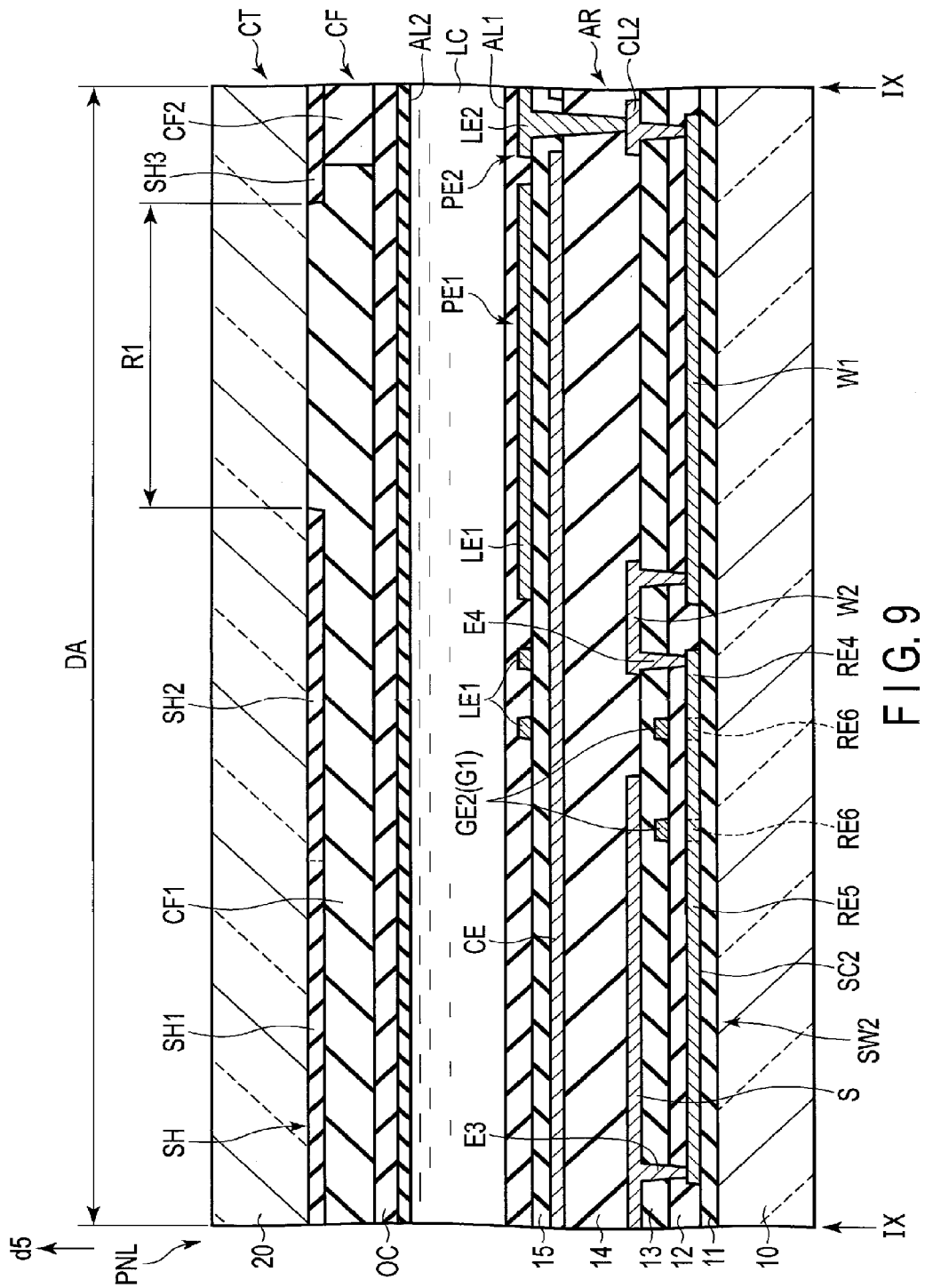
FIG. 9 is a cross-sectional view showing the liquid crystal display panel along the line IX-IX of FIG. 7.

FIG. 9 is a cross-sectional view showing the liquid crystal display panel along the line IX-IX of FIG. 7.

As shown in FIG. 9, the array substrate AR is formed by using a phototransmissive first insulating substrate 10 such as a glass substrate or a resinous substrate. The array substrate AR comprises an insulating film 11 as a first insulating film, an insulating film 12, an insulating film 13 as a second insulating film, an insulating film 14, an insulating film 15, the second switching element SW2, the first scanning line G1, the first line W1, the second line W2, the signal line S, the first pixel electrode PE1, the second pixel electrode PE2, the common electrode CE, a first alignment film AL1. In the example shown in FIG. 9, the second switching element SW2 has a top-gate structure. In a manner different from that of the present embodiment, each switching element SW may have a bottom-gate structure.

The insulating film 11 is formed on the first insulating substrate 10. The first line W1 and the second semiconductor layer SC2 of the second switching element SW2 are formed on the insulating film 11. The insulating film 12 is formed on the insulating film 11, the first line W1 and the second semiconductor layer SC2. The first scanning line G1 is formed on the insulating film 12. The second gate electrodes GE2 face the sixth regions RE6.

The insulating film 13 is formed on the first scanning line G1 and the insulating film 12. The signal line S, the second line W2 and the conductive layer CL2 are formed on the insulating film 13. The signal line S passes through a contact hole penetrating the insulating films 12 and 13, and is in contact with the fifth region RE5 of the second semiconductor layer SC2. The signal line S is integrally formed with the third electrode E3. On one side, the second line W2 passes through a contact hole penetrating the insulating films 12 and 13, and is contact with the fourth region RE4 of the second semiconductor layer SC2. The second line W2 is integrally formed with the fourth electrode E4. On the other side, the second line W2 passes through a contact hole penetrating the insulating films 12 and 13, and is in contact with the first line W1. As a matter of course, the second semiconductor layer SC2 is electrically connected to the first line W1 via the second line W2. The conductive layer CL2 passes through a contact hole penetrating the insulating films 12 and 13, and is in contact with the first line W1.

The insulating film 14 is formed on the insulating film 13, the signal line S, the second line W2 and the conductive layer CL2. The common electrode CE is formed on the insulating film 14. The insulating film 15 is formed on the insulating film 14 and the common electrode CE. The insulating materials used for the insulating films 11 to 15 are not particularly limited. For example, the insulating films 11, 12, 13 and 15 are formed of inorganic materials such as silicon nitride (SiN) or silicon oxide (SiO). The insulating film 14 is formed of an organic material such as acrylic resin.

The first pixel electrode PE1 and the second pixel electrode PE2 are formed on the insulating film 15. The second pixel electrode PE2 passes through a contact hole penetrating the insulating films 14 and 15, and is in contact with the conductive layer CL2. The common electrode CE and the pixel electrodes PE (linear electrodes LE) are formed of conductive materials. For example, the common electrode CE and the pixel electrodes PE are formed of transparent conductive materials such as indium zinc oxide (IZO) or indium tin oxide (ITO). The first alignment film AL1 is formed on the insulating film 15 and the pixel electrodes PE.

The counter-substrate CT is formed by using a phototransmissive second insulating substrate 20 such as a glass substrate or resinous substrate. The counter-substrate CT comprises the light-shielding layer SH, a color filter CF, an overcoat layer OC, a second alignment film AL2, etc. The color filter CF comprises a plurality of color layers having different colors, shapes and sizes.

The light-shielding layer SH comprises the first extension portion SH1 facing the signal line S, the second extension portion SH2 facing the first scanning line G1, and the third extension portion SH3 located between the first and second pixel electrodes PE1 and PE2 and facing the end portions of the first and second pixel electrodes PE1 and PE2.

The color layer CF1 faces the first pixel electrode PE1. The color layer CF2 faces the second pixel electrode PE2. The end portions of the color layers CF1 and CF2 overlap the light-shielding layer SH. The overcoat layer OC is formed of a transparent resinous material, and covers the color filter CF such as the color layers CF1 and CF2. The second alignment film AL2 is formed on the overcoat layer OC on the side facing the array substrate AR.

In the example of FIG. 9, the color filter CF is formed on the counter-substrate CT. However, the color filter CF may be formed on the array substrate AR. The color filter CF may be formed without the color layer CF2.

The liquid crystal display device DSP of the present embodiment is formed as described above.

Now, this specification explains the directions in which the linear electrodes LE of the pixel electrodes PE extend, the directions of intersection of the linear electrodes LE with the scanning lines G, etc. As explained above, the linear electrodes LE extend in the third direction d3 and the fourth direction d4.

As shown in FIG. 10, this specification looks at the first and fourth pixels MP1 and MP4 adjacent to each other in the second direction d2 across the intervening first scanning line G1. The first linear electrodes LE1 of the first pixel MP1 and the first linear electrodes LE1 of the fourth pixel MP4 are integrally formed, are electrically connected to each other, and intersect with the first scanning line G1 at a first angle θ1. The first angle θ1 is an obtuse angle (90°<θ1<180°). The first angle θ1 is made by a start line L1a along the first scanning line G1 and an end line L1b positioned by rotating in the first rotation direction around a point on the start line La1. As described above, in the present embodiment, the first rotation direction is clockwise.

Now, this specification looks at the second and third pixels MP2 and MP3 adjacent to each other in the second direction d2 across the intervening second scanning line G2. The first linear electrodes LEI of the second pixel MP2 and the first linear electrodes LE1 of the third pixel MP3 are integrally formed, are electrically connected to each other, and intersect with the second scanning line G2 at a second angle e2. The second angle θ2 is an acute angle (0°<θ2<90°). The second angle θ2 is made by a start line L2a along the second scanning line G2 and an end line L2b positioned by rotating in the first rotation direction around a point on the start line L2a.

The first angle θ1 and the second angle θ2 should be set such that one of them is an obtuse angle, and the other one is an acute angle.

The liquid crystal display device DSP is structured as described above.

Now, this specification explains a method for manufacturing the liquid crystal display device DSP. Here, this specification explains a method for manufacturing the array substrate AR of the liquid crystal display device DSP, specifically, a method for manufacturing the semiconductor layers SC, the first line W1, the scanning lines G, the signal lines S, the second line W2 and the conductive layers CL.

As shown in FIG. 11, as the first step for manufacturing the array substrate AR, the semiconductor layers SC and the first line W1 are formed. The semiconductor layers SC and the first line W1 are formed of the same material, and are formed at the same time. The semiconductor layers SC and the first line W1 are formed by a common method. In the present embodiment, the semiconductor layers SC and the first line W1 are formed of polycrystalline silicon.

For example, the formation of the semiconductor layers SC and the first line W1 includes formation of an amorphous silicon film, formation of a polycrystalline silicon film by annealing and recrystallizing the amorphous silicon film, and patterning of the polycrystalline silicon film. The whole semiconductor layers SC may be lightly doped with boron. Thus, a p⁻ region may be formed.

As shown in FIG. 12, the first scanning line G1 is formed after the formation of the semiconductor layers SC and the first line W1, and the formation of the insulating film 12. Subsequently, the first scanning line G1 is used as a mask to implant impurities into the semiconductor layers SC and the first line W1. In the present embodiment, the switching elements SW such as the second switching element SW2 are n-type thin-film transistors. However, unlike the present embodiment, the switching elements SW may be p-type thin-film transistors.

As described above, the switching elements SW are n-type thin-film transistors. Thus, the semiconductor layers SC are highly doped with phosphorus to form an n⁺ region. In this way, the fourth region RE4 which is an n⁺ region and the fifth region RE5 which is an n⁺ region are formed in the second semiconductor layer SC2. One of the fourth and fifth regions RE4 and RE5 functions as a source region, and the other region functions as a drain region.

When the semiconductor layers SC are doped with phosphorus, the first line W1 may be more highly doped with phosphorous. This process is applied such that the impurity concentration of the first line W1 is higher than that of each of the fourth and fifth regions RE4 and RE5, and the resistance of the first line W1 is lower than that of each of the fourth and fifth regions RE4 and RE5.

At this time, the second semiconductor layer SC2 is located at some point distant from the first line W1. Since the second semiconductor layer SC2 is not formed continuously with the first line W1, load is not supplied from the first line W1 to the second semiconductor layer SC2. In this way, it is possible to eliminate a detrimental effect caused by the load flowing into the second semiconductor layer SC2. For example, it is possible to reduce electrostatic destruction of the insulating film 12 which causes a shortcircuit between the second semiconductor layer SC2 and the second gate electrodes GE2 (first scanning line G1). Thus, the destruction of the second switching element SW2 can be reduced.

The semiconductor layers SC may further comprise an extension region (LDD region). For example, the second semiconductor layer SC2 may comprise an extension region which is an n⁻ region between the fourth and sixth regions RE4 and RE6 and between the fifth and sixth regions RE5 and RE6. The extension region can be formed by applying ion doping with phosphorus in low concentration.

Figure 13:
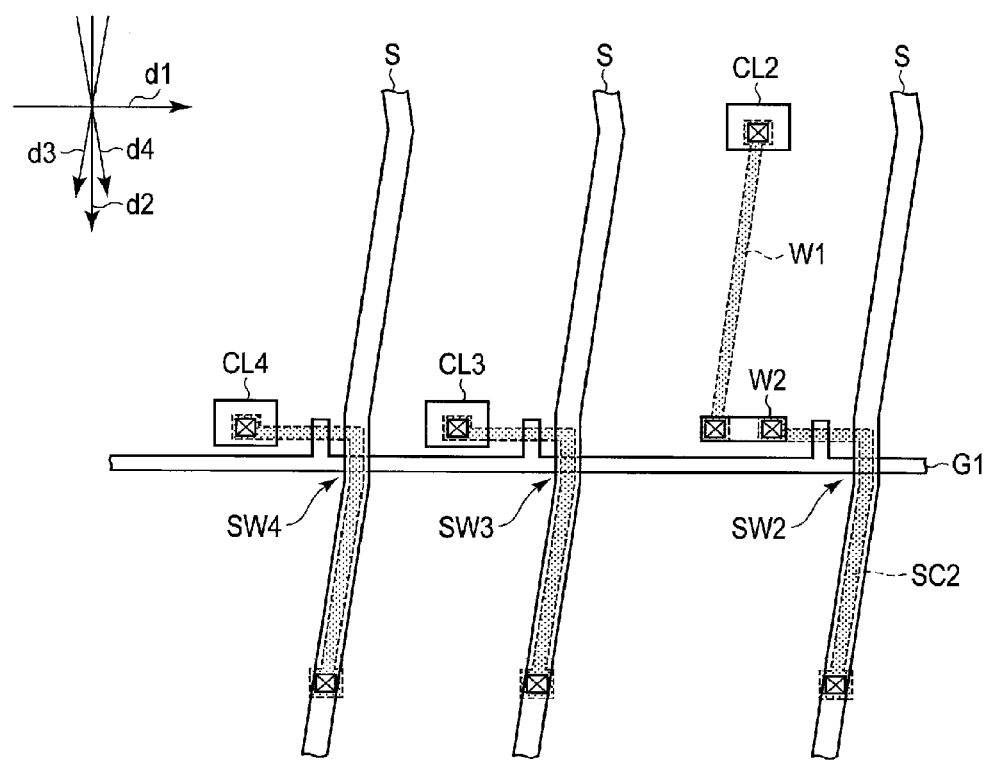
FIG. 13 is a plan view shown for explaining the method for manufacturing the array substrate following FIG. 12.

As shown in FIG. 13, the signal lines S, the conductive layers CL and the second line W2 are formed after the implantation of impurities into the semiconductor layers SC and the first line W1, and the formation of the insulating film 13. The signal lines S, the conductive layers CL and the second line W2 are formed of the same metal material, and are formed at the same time. The semiconductor layer SC and the first line W1 are connected by the second line W2.

The array substrate AR is manufactured by the above process.

In the liquid crystal display device DSP of the embodiment having the above structure, the liquid crystal display panel PNL comprises the first scanning line G1 extending in the first direction d1, the third scanning line G3 extending in the first direction d1 and located at some point distant from the first scanning line G1 in the second direction d2, the second scanning line G2 extending in the first direction d1 and located between the first scanning line G1 and the third scanning line G3, the first pixel MP1, and the second pixel MP2.

The first pixel MP1 comprises the first color subpixel SP1. The first color subpixel SP1 of the first pixel MP1 includes the first linear electrodes LE1 extending in the third direction d3, and the first pixel electrode PE1 electrically connected to the second scanning line G2 via the first switching element SW1.

The second pixel MP2 comprises the first color subpixel SP1. The first color subpixel SP1 of the second pixel MP2 includes the first linear electrodes LE1 extending in the fourth direction d4, and the first pixel electrode PE1 electrically connected to the third scanning line G3 via the first switching element SW1. In the first pixel MP1 and the second pixel MP2, each first pixel electrode PE1 comprises the first linear electrodes LE1.

The first pixel electrode PE1 (the first linear electrodes LE1) of the second pixel MP2 is located between the first scanning line G1 and the second scanning line G2. The first scanning line G1 is located between the first pixel electrode PE1 (the first linear electrodes LE1) of the first pixel MP1 and the first pixel electrode PE1 (the first linear electrodes LE1) of the second pixel MP2. The V-shape of the pixels MP is horizontally inverted line by line.

Thus, it is possible to reduce the dependence of color chromaticity on the viewing angle in the first direction d1 (horizontal direction) in comparison with a case where the first linear electrodes LE1 extend in one of the third and fourth directions d3 and d4 in both the first pixel MP1 and the second pixel MP2. In this way, the color of the display image can be the same for a user located on the left side of the screen and a user located on the right side of the screen.

As described above, the V-shape of the pixels MP is horizontally inverted line by line. Thus, a region in which the direction of alignment of a director is the same in the second direction d2 is twice as long as that in a case where the V-shape of the pixels MP is not horizontally inverted line by line. In other words, in the present embodiment, the domain of each of the first, third and fourth colors tends to be long in the second direction d2. Therefore, in the present embodiment, the pitch of the pixels MP in the second direction d2 is less than or equal to 250 μm. The pitch of the pixels MP in the second direction d2 is substantially the same as the pitch P of the scanning lines G in the second direction d2 in FIG. 10.

When the pitch P is 250 μm, and further when the viewing distance for viewing the pixels is greater than or equal to 50 cm, the user hardly sees a color streak based on each domain or a streak caused by the difference in the luminance in raster display. The pitch P may be less than or equal to 200 μm. For example, when the pitch P is 200 μm, and further when the viewing distance is greater than or equal to 40 cm, the user hardly sees the above streaks. The pitch P may be less than or equal to 150 μm. When the pitch P is 150 μm, and further when the viewing distance is greater than or equal to 30 cm, the user hardly sees the above streaks.

The above structure realizes a liquid crystal display panel PNL and a liquid crystal display device DSP excellent in display quality.

Modification Example 1

Figure 14:
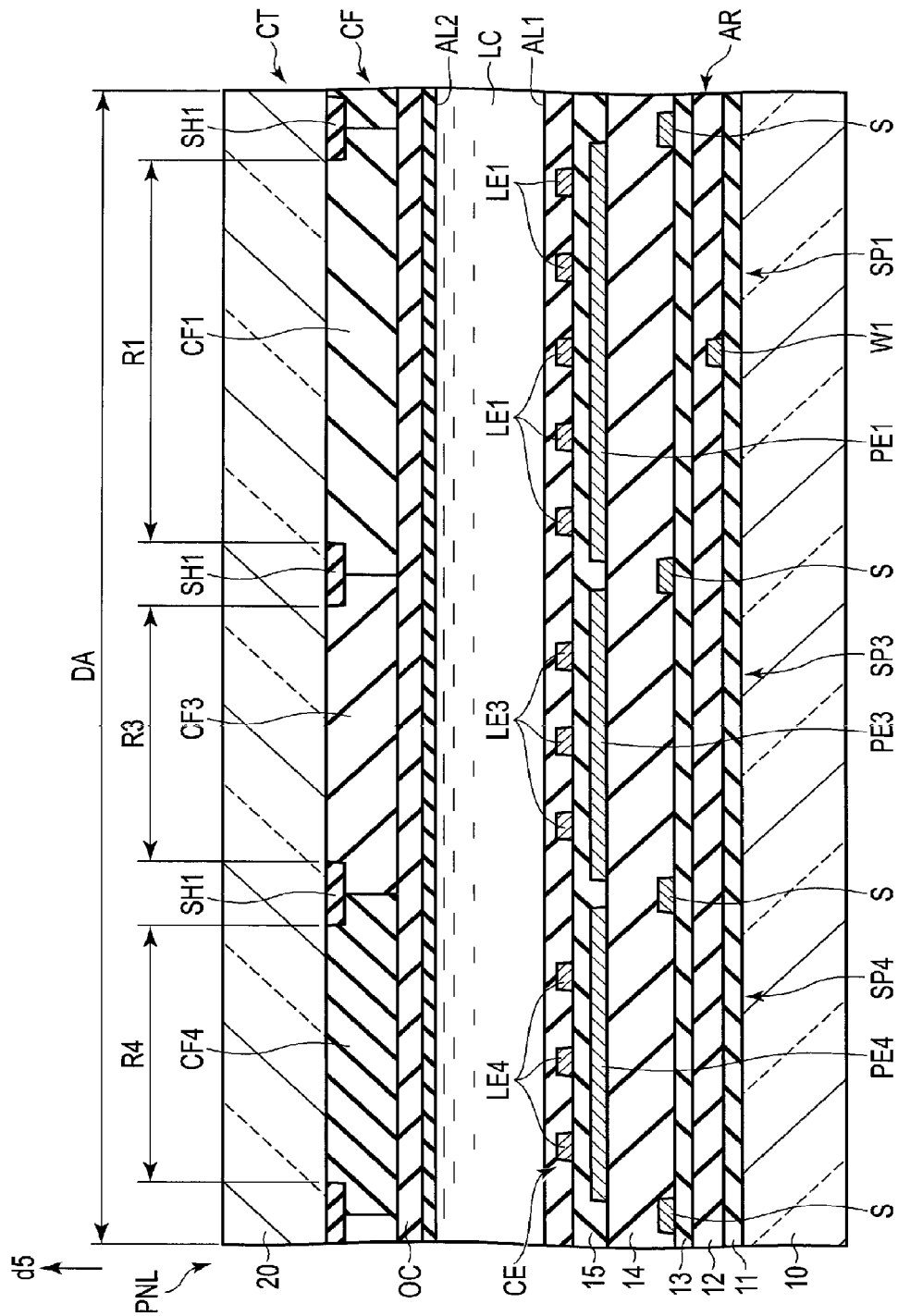
FIG. 14 is an enlarged cross-sectional view showing a part of the liquid crystal display panel of modification example 1 of the embodiment.

FIG. 14 is an enlarged cross-sectional view showing a part of the liquid crystal display panel PNL according to modification example 1 of the above embodiment.

As shown in FIG. 14, the liquid crystal display panel PNL of modification example 1 is different from that of the above embodiment in terms of the positional relationship between the pixel electrodes PE and the common electrode CE. The first pixel electrode PE1, the third pixel electrode PE3 and the fourth pixel electrode PE4 are formed on the insulating film 14, and are covered by the insulating film 15. In modification example 1, each pixel electrode PE has a planar shape, and does not comprise any linear electrode LE.

The common electrode CE is formed on the insulating film 15, and is covered by the first alignment film AL1. The common electrode CE is located above the pixel electrode PE. The common electrode CE comprises a plurality of types of linear electrodes LE, specifically, first, second, third and fourth linear electrodes LE1, LE2, LE3 and LE4. The first linear electrodes LE1 of the common electrode CE face the first pixel electrode PE1. The third linear electrodes LE3 of the common electrode CE face the third pixel electrode PE3. The fourth linear electrodes LE4 of the common electrode CE face the fourth pixel electrode PE4.

In modification example 1, the first subpixel SP1 comprises the first linear electrodes LE1. The third subpixel SP3 comprises the third linear electrodes LE3. The fourth subpixel SP4 comprises the fourth linear electrodes LE4. Although not shown in FIG. 14, the second subpixel SP2 comprises the second linear electrodes LE2.

In plan view, the positional relationships are as follows. The first linear electrodes LE1 which are common electrodes correspond to the first pixel electrodes PE1 of the above embodiment. The second linear electrodes LE2 which are common electrodes correspond to the second pixel electrodes PE2 of the above embodiment. The third linear electrodes LE3 which are common electrodes correspond to the third pixel electrodes PE3 of the above embodiment. The fourth linear electrodes LE4 which are common electrodes correspond to the fourth pixel electrodes PE4 of the above embodiment.

Effects similar to those of the above embodiment can be obtained from the liquid crystal display device DSP of modification example 1 having the above structure. When the common electrode CE comprises the linear electrodes LE, similarly, the first line W1 preferably extends along the first linear electrodes LE1. The structure of modification example 1 may be applied to the modification examples described below.

Modification Example 2

FIG. 15 is a structural diagram showing one of the groups MPG of pixels of the liquid crystal display panel PNL of modification example 2 of the above embodiment, and shows the scanning lines G, the signal lines S, the pixel electrodes PE and the light-shielding layer SH.

As shown in FIG. 15, the liquid crystal display panel PNL of modification example 2 is different from that of the above embodiment in terms of the shapes of the pixel electrodes PE, the signal lines S, the regions R and the light-shielding layer SH. In the above embodiment, each linear electrode LE has a V-shape in the pixels MP. In modification example 2, the linear electrodes LE adjacent to each other in the second direction d2 form a V-shape in a pair of pixels MP adjacent to each other in the second direction d2.

In modification example 2, the number of types of direction of alignment of liquid crystal molecules by an electric field is less in the regions R1, R3 and R4 having the first area (middle-sized area) or the third area (large area) than that in the above embodiment.

However, the combination of the same regions in the group MPG of pixels in modification example 2 has the same number of types of direction of alignment of the liquid crystal by an electric field as the above embodiment. In other words, the number of domain types of each region in the group MPG of pixels in modification example 2 is the same as that in the above embodiment. In the group MPG of pixels, the areas of domain types of regions are substantially equalized.

Thus, it is possible to reduce the dependence on the viewing angle in the first direction d1 (horizontal direction) in modification example 2.

Modification Example 3

FIG. 16 is a structural diagram showing one of the groups MPG of pixels of the liquid crystal display panel PNL of modification example 3 of the above embodiment, and shows the scanning lines G, the signal lines S, the pixel electrodes PE and the light-shielding layer SH.

As shown in FIG. 16, the liquid crystal display panel PNL of modification example 3 is different from that of the above embodiment in terms of the positions of the scanning lines G, the shapes of the regions R and the shape of the light-shielding layer SH.

Each third extension portion SH3 of the light-shielding layer SH does not have a strip-shape, and has a band-shape. Each third extension portion SH3 continuously extends from an end to the other end of the display area DA in the first direction d1 in a manner similar to that of the second extension portions SH2. In the first pixel MP1, the first linear electrodes LE1 and the second linear electrodes LE2 are adjacent to each other in the second direction d2 across the intervening scanning line G1. In the second pixel MP2, the first linear electrodes LE1 and the second linear electrodes LE2 are adjacent to each other in the second direction d2 across the intervening scanning line G2.

Now, this specification looks at a plan view in which the first and second linear electrodes LE1 and LE2 are located on the left and right sides, respectively, in the first and second pixels MP1 and MP2. For example, the pattern of the first and second linear electrodes LE1 and LE2 of the first pixel MP1 has a V-shape. The pattern of the first and second linear electrodes LE1 and LE2 of the second pixel MP2 has a λ-shape.

In a manner different from that of modification example 3, the linear electrodes LE may have the above shapes in a plan view in which the first and second linear electrodes LE1 and LE2 are located on the right and left sides, respectively, in the first and second pixels MP1 and MP2.

The first scanning line G1 intersects with each bend portion of the above V-shape. The second scanning line G2 intersects with each bend portion of the above λ-shape.

In modification example 3, instead of the second extension portions SH2, the third extension portions SH3 face the scanning lines G, and extend along the scanning lines G. Although not shown in FIG. 16, for example, the switching elements SW and the conductive layers CL face the third extension portions SH3 instead of the second extension portions SH2 in modification example 3.

In modification example 3, similarly, it is possible to reduce the dependence on the viewing angle in the first direction d1 (horizontal direction).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. It is possible to combine two or more embodiments if needed.

For example, the first direction d1 or the second direction d2 is not limited to the above embodiments, and may be modified in various ways. For example, in the plan view shown in FIG. 3, the first direction d1 may be left-pointing, or the second direction d2 may be upward. In regions where the first linear electrodes LE1 intersect with the light-shielding layer SH, as shown in FIG. 17, the light-shielding layer SH may be eliminated. Instead of eliminating the light-shielding layer SH, the regions may be narrowed in the second direction d2 than the other regions, or only the regions in which the semiconductors are formed may be left. These structures may be applied to the above embodiments and modification examples.

The liquid crystal display panel PNL of the above embodiments has a structure corresponding to an FFS mode, which is one of in-plane switching (IPS) modes for performing display using a lateral electric field, as a display mode. However, the liquid crystal display panel PNL may have a structure corresponding to other display modes. For example, the liquid crystal display panel PNL may have a structure corresponding to a normal IPS mode in which the array substrate AR comprises both a linear pixel electrode PE and a linear common electrode CE, or a structure in which the array substrate AR comprises a linear or planar pixel electrode PE, and the counter-substrate CT comprises a common electrode CE.

Each of the above switching elements SW may not be a double-gate thin-film transistor, and may be a single-gate thin-film transistor.

The above embodiments may be widely applied to a small, middle-sized or large display device.

What is claimed is:

1. A liquid crystal display device comprising:
a first scanning line extending in a first direction;
a third scanning line extending in the first direction and being distant from the first scanning line in a second direction perpendicular to the first direction;
a second scanning line extending in the first direction and located between the first scanning line and the third scanning line;
a first linear electrode located between the first scanning line and the second scanning line and extending in a third direction inclined from the second direction at an acute angle in a first rotation direction;
a second linear electrode located between the first scanning line and the second scanning line and extending in a fourth direction inclined from the second direction at an acute angle in a second rotation direction opposite to the first rotation direction; and
a third linear electrode located between the second scanning line and the third scanning line and comprising a portion extending in the fourth direction, wherein
the second linear electrode is electrically connected to the third linear electrode.

2. The device of claim 1, further comprising
a fourth linear electrode located between the second scanning line and the third scanning line and extending in the third direction, wherein
the second linear electrode, the third linear electrode and the fourth linear electrode are integrally formed by a transparent conductive film.

3. The device of claim 2, further comprising
a first subpixel including a subpixel displaying a third color, and
a second subpixel including a subpixel displaying a fourth color, wherein
the first linear electrode is provided in a subpixel displaying a second color, and
the second linear electrode, the third linear electrode and the fourth linear electrode are provided in a subpixel displaying a first color.

4. The device of claim 3, wherein
light of the first color is blue light, and has a wavelength greater than or equal to 380 nm and less than 490 nm,
light of the second color is white light,
light of the third color is green light, and has a wavelength greater than or equal to 490 nm and less than 590 nm, and
light of the fourth color is red light, and has a wavelength greater than or equal to 590 nm and less than 780 nm.

5. The device of claim 2, wherein
the first linear electrode, the second linear electrode, the third linear electrode and the fourth linear electrode are common electrodes.

6. The device of claim 1, wherein
the second linear electrode is connected to a transistor connected to the third scanning line.

7. The device of claim 1, wherein
the first linear electrode is connected to a transistor connected to the second scanning line.

8. The device of claim 1, further comprising:
a first subpixel comprising a fifth linear electrode located between the first scanning line and the second scanning line; and a second subpixel comprising a sixth linear electrode located between the second scanning line and the third scanning line, wherein in a plan view, the fifth linear electrode has a V-shape, and the sixth linear electrode has a shape obtained by vertically inverting the V-shape.

9. The device of claim 1, wherein the first linear electrode, the second linear electrode and the third linear electrode are common electrodes.

10. A liquid crystal display device comprising:

a first scanning line extending in a first direction;

a second scanning line extending in the first direction and adjacent to the first scanning line in a second direction so as to be distant from the first scanning line, the second direction being perpendicular to the first direction; and a plurality of groups of pixels in matrix in the first direction and the second direction, wherein each of the groups of pixels comprises a first pixel, a second pixel, a third pixel adjacent to the first pixel in the first direction and adjacent to the second pixel in the second direction, and a fourth pixel adjacent to the second pixel in the first direction and adjacent to the first pixel in the second direction, each of the first to fourth pixels comprises a first color subpixel including a first linear electrode, the first linear electrode of the first pixel and the first linear electrode of the fourth pixel are integrally formed, are electrically connected to each other, and intersect with the first scanning line at a first angle, in the first and fourth pixels adjacent to each other in the second direction across the intervening first scanning line, the first linear electrode of the second pixel and the first linear electrode of the third pixel are integrally formed, are electrically connected to each other, and intersect with the second scanning line at a second angle, in the second and third pixels adjacent to each other in the second direction across the intervening second scanning line, the first angle is an obtuse angle, and is made by a start line along the first scanning line and an end line positioned by rotating around a point on the start line in a first rotation direction, and the second angle is an acute angle, and is made by a start line along the second scanning line and an end line positioned by rotating around a point on the start line in the first rotation direction.

11. The device of claim 10, wherein the first linear electrode is formed by a transparent conductive film.

12. The device of claim 10, wherein the first linear electrode is a common electrode.

13. A liquid crystal display device comprising:

a first scanning line extending in a first direction;

a second scanning line extending in the first direction and adjacent to the first scanning line in a second direction so as to be distant from the first scanning line, the second direction being perpendicular to the first direction;

a first pixel comprising a first color subpixel including a first linear electrode, and a second color subpixel including a second linear electrode; and a second pixel comprising a first color subpixel including a first linear electrode, and a second color subpixel including a second linear electrode, wherein the first linear electrode and the second linear electrode are adjacent to each other in the second direction across the intervening first scanning line in the first pixel, the first linear electrode and the second linear electrode are adjacent to each other in the second direction across the intervening second scanning line in the second pixel, and in a plan view where the first and second linear electrodes are located on left and right sides, respectively, or in a plan view where the first and second linear electrodes are located on right and left sides, respectively, in each of the first and second pixels, a pattern of the first and second linear electrodes of the first pixel has a V-shape, and a pattern of the first and second linear electrodes of the second pixel has a shape obtained by vertically inverting the V-shape, the first scanning line intersects with a bend portion of the V-shape, and the second scanning line intersects with a bend portion of the shape obtained by vertically inverting the V-shape.

14. The device of claim 13, wherein the first linear electrode is formed by a transparent conductive film.

15. The device of claim 13, wherein the first linear electrode is a common electrode.

* * * * *